US008823374B2

(12) United States Patent
Weller et al.

(10) Patent No.: US 8,823,374 B2
(45) Date of Patent: Sep. 2, 2014

(54) SYSTEM FOR ACCELERATED MR IMAGE RECONSTRUCTION

(75) Inventors: Daniel Weller, Cambridge, MA (US); Vivek K Goyal, Cambridge, MA (US); Jonathan Rizzo Polimeni, Cambridge, MA (US); Leo Grady, Yardley, PA (US)

(73) Assignees: Siemens Aktiengesellschaft (DE); The General Hospital Corporation, Boston, MA (US)

( * ) Notice: Subject to any disclaimer, the term of this patent is extended or adjusted under 35 U.S.C. 154(b) by 417 days.

(21) Appl. No.: 13/326,622

(22) Filed: Dec. 15, 2011

(65) Prior Publication Data

US 2012/0081114 A1  Apr. 5, 2012

Related U.S. Application Data

(63) Continuation-in-part of application No. 12/788,439, filed on May 27, 2010, now Pat. No. 8,692,549.

(60) Provisional application No. 61/181,312, filed on May 27, 2009, provisional application No. 61/451,162, filed on Mar. 10, 2011.

(51) Int. Cl.
*G01V 3/00* (2006.01)
*G01R 33/561* (2006.01)

(52) U.S. Cl.
CPC ................. *G01R 33/5611* (2013.01)
USPC .......................... 324/309; 324/307

(58) Field of Classification Search
CPC .................. G01R 33/5611; G01R 33/5612
USPC .................... 324/309, 307, 312, 300
See application file for complete search history.

(56) References Cited

U.S. PATENT DOCUMENTS

| | | | | |
|---|---|---|---|---|
| 6,841,998 B1 * | 1/2005 | Griswold | ....................... | 324/309 |
| 6,906,516 B2 * | 6/2005 | Bangerter et al. | ............ | 324/309 |
| 7,394,252 B1 * | 7/2008 | Lin | ................................ | 324/309 |
| 7,795,869 B1 * | 9/2010 | Bydder | ........................ | 324/309 |
| 2010/0308824 A1 | 12/2010 | Grady | | |

OTHER PUBLICATIONS

Daniel S. Weller, et al., "Sparse Reconstruction of Images Using the Nullspace Method and GRAPPA (SpRING)", manuscript.
Candes E, Rombert J, Tao T, "Robust uncertainty principles: Exact signal reconstruction from highly incomplete frequency information", IEEE Transactions on Information Theory 2006:489-509.

(Continued)

*Primary Examiner* — Louis Arana
(74) *Attorney, Agent, or Firm* — Peter R. Withstandley

(57) ABSTRACT

An MR imaging system uses the multiple RF coils for acquiring corresponding multiple image data sets of the slice. An image data processor comprises at least one processing device conditioned for, generating a composite MR image data set representing a single image in a single non-iterative operation by performing a weighted combination of luminance representative data of individual corresponding pixels of the multiple image data sets in providing an individual pixel luminance value of the composite MR image data set. The image data processor reduces noise in the composite MR image data set by generating a reduced set of significant components in a predetermined transform domain representation of data representing the composite image to provide a de-noised composite MR image data set. An image generator comprises at least one processing device conditioned for, generating a composite MR image using the de-noised composite MR image data set.

15 Claims, 15 Drawing Sheets

(56) References Cited

OTHER PUBLICATIONS

Candes E, Rombert J, "Quantitative robust uncertainty principles and optimally sparse decompositions", Foundations of Computational Mathematics 2006:227-254.

Donoho D, "Compressed sensing", IEEE Transactions on Information Theory 2006:1289-1306.

Griswold M, Jakob P, Heidemann R, Nittka M, Jellus V, Wang J, Kiefer B, Haase A, "Generalized autocalibrating partially parallel acquisitions (GRAPPA)", Magn Reson Med 2002;47(6):1202-1210.

Lustig M, Alley M, Vasanawala SS, Donoho DL, Pauly JM, "L1 SPIR-IT: Autocalibrating Parallel Imaging Compressed Sensing", 17th Annual Meeting of ISMRM. Honolulu, HI, USA: ISMRM; 2009. p. 379.

Murphy M, Keutzer K, Vasanawala S, Lustig M, "Clinically Feasible Reconstruction Time for L1-SPIRiT Parallel Imaging and Compressed Sensing MRI", 18th Annual Meeting of ISMRM. Stockholm, Sweden: ISMRM; 2010. p. 4854.

Pruessmann K, Weiger M, Scheidegger M, Boesiger P, "SENSE: sensitivity encoding for fast MRI", Magn Reson Med 1999;42(5):952-962.

Sodickson D, Manning W, "Simultaneous acquisition of spatial harmonics (SMASH): fast imaging with radiofrequency coil arrays", Magn Reson Med 1997;38(4):591-603.

Lustig M, Pauly J, "SPIRiT: Iterative self-consistent parallel imaging reconstruction from arbitrary k-space", Magn Reson Med 2010;64(2):457-471.

Mallat S, Zhang Z, "Matching Pursuits with Time-Frequency Dictionaries", IEEE Transactions on Signal Processing 1993:3397-3415.

Grady LJ, Polimeni JR, "Nullspace Compressed Sensing for Accelerated Imaging", 17th Annual Meeting of ISMRM. Honolulu, HI, USA: ISMRM; 2009. p. 2820.

Lustig M, Donoho D, Pauly J, "Sparse MRI: The application of compressed sensing for rapid MR imaging", Magn Reson Med 2007;58(6):1182-1195.

Weller DS, Polimeni JR, Grady LJ, Wald LL, Adalsteinsson E, Goyal VK, "Combining nonconvex compressed sensing and GRAPPA using the nullspace method", 18th Annual Meeting of ISMRM. Stockholm, Sweden: ISMRM; 2010. p. 4880.

Fischer A, Seiberlich N, Blaimer M, Jakob PM, Breuer FA, Griswold MA, "A Combination of Nonconvex Compressed Sensing and GRAPPA (CS-GRAPPA)", 17th Annual Meeting of ISMRM. Honolulu, HI, USA: ISMRM; 2009. p. 2813.

Liang D, Liu B, Wang J, Ying L, "Accelerating SENSE using compressed sensing", Magn Reson Med 2009;62 (6):1574-1584.

Chartrant R, "Exact reconstruction of sparse signals via nonconvex minimization", IEEE Signal Processing Letters 2007:707-710.

Trzasko J, Manduca A, Borisch E, "Robust kernel methods for sparse MR image reconstruction", Medical Image Computing and Computer-Assisted Intervention—MICCAI 2007, Pt 1, Proceedings 2007:809-816.

Sing-Long CA, Tejos CA, Irarrazaval P, "Evaluation of Continuous Approximation Functions for the L0-Norm for Compressed Sensing", 17th Annual Meeting of ISMRM. Honolulu, HI, USA: ISMRM; 2009. p. 4585.

Trzasko J, Manduca A, "Highly Undersampled Magnetic Resonance Image Reconstruction via Homotopic I(0)-Minimization", IEEE Transactions on Medical Imaging 2009:106-121.

Malioutov D, Cetin M, Willsky A, "Homotopy continuation for sparse signal representation", 2005 IEEE International Conference on Acoustics, Speech, and Signal Processing, vols. 1-5 2005:733-736.

Roemer P, Edelstein W, Hayes C, Souza S, Mueller O, "The NMR phased array", Magn Reson Med 1990;16(2):192-225.

Holland P, Welsch R, "Robust Regression Using Iteratively Re-Weighted Least-Squares", Communications in Statistics Part a—Theory and Methods 1977:813-827.

Zelinski A, Goyal V, Adalsteinsson E, "Simultaneously Sparse Solutions to Linear Inverse Problems with Multiple System Matrices and a Single Observation Vector", SIAM Journal on Scientific Computing 2010:4533-4579.

Fong DC-L, Saunders MA, LSMR: An iterative algorithm for sparse least-squares problems: Systems Optimization Laboratory, Stanford University; 2010.

Candes E, Demanet L, Donoho D, Ying L, "Fast discrete curvelet transforms", Multiscale Modeling & Simulation 2006:861-899.

Do M, Vetterli M, "The contourlet transform: An efficient directional multiresolution image representation", IEEE Transactions on Image Processing 2005:2091-2106.

Easley G, Labate D, Lim W, "Sparse directional image representations using the discrete shearlet transform", Applied and Computational Harmonic Analysis 2008:25-46.

Breuer F, Kannengiesser S, Blaimer M, Seiberlich N, Jakob P, Griswold M, "General formulation for quantitative G-factor calculation in GRAPPA reconstructions", Magn Reson Med 2009;62(3):739-746.

Robson PM, Grang AK, Madhuranthakam AJ, Lattanzi R, Sodickson DK, McKenzie CA, "Comprehensive quantification of signal-to-noise ratio and g-factor for image-based and k-space-based parallel imaging reconstructions", Magn Reson Med 2008;60(4):895-907.

\* cited by examiner

FIGURE 13

1. Estimate coil sensitivities from low-resolution data, and compute $\mathbf{C}$.
2. Compute GRAPPA kernel and run GRAPPA reconstruction on data $\mathbf{d}$ to yield result $\mathbf{Wd}$.
3. Initialization:

$\alpha \leftarrow \alpha_0$, $\mathbf{x} \leftarrow$ initial guess (from GRAPPA result or previous run of method), $\mathbf{w} \leftarrow \Psi F^{-1}\left(\mathbf{K}^T \mathbf{d} + \left(\mathbf{K}^c\right)^T \mathbf{x}\right)$, $\mathbf{D}_\alpha(\mathbf{w}) \leftarrow \text{diag}\left(\frac{1}{w_1}\frac{\partial \|\mathbf{w}\|_{S(\alpha)}}{\partial w_1}, \ldots, \frac{1}{w_n}\frac{\partial \|\mathbf{w}\|_{S(\alpha)}}{\partial w_n}\right)$.

4. $\mathbf{A} \leftarrow \begin{bmatrix} \sqrt{\lambda}\mathbf{D}_\alpha(\mathbf{w})^{1/2}\Psi \\ \mathbf{C} \end{bmatrix} F^{-1}\left(\mathbf{K}^c\right)^T$, $\mathbf{b} \leftarrow \begin{bmatrix} -\sqrt{\lambda}\mathbf{D}_\alpha(\mathbf{w})^{1/2}\Psi F^{-1}\mathbf{K}^T\mathbf{d} \\ \mathbf{C}F^{-1}\left(\mathbf{W} - \mathbf{K}^T\right)\mathbf{d} \end{bmatrix}$, $\mathbf{x} \leftarrow$ LSMR($\mathbf{A}, \mathbf{b}$)

5. $\mathbf{w} \leftarrow \Psi F^{-1}\left(\mathbf{K}^T \mathbf{d} + \left(\mathbf{K}^c\right)^T \mathbf{x}\right)$, $\mathbf{D}_\alpha(\mathbf{w}) \leftarrow \text{diag}\left(\frac{1}{w_1}\frac{\partial \|\mathbf{w}\|_{S(\alpha)}}{\partial w_1}, \ldots, \frac{1}{w_n}\frac{\partial \|\mathbf{w}\|_{S(\alpha)}}{\partial w_n}\right)$ 6. Repeat steps 4-5 until convergence, increasing $\alpha$ according to continuation scheme.
7. Full k-space result: $\mathbf{y} \leftarrow \mathbf{K}^T\mathbf{d} + \left(\mathbf{K}^c\right)^T\mathbf{x}$. Combined image:

$\mathbf{I} \leftarrow \left[\mathbf{C}_1, \ldots, \mathbf{C}_P\right]F^{-1}\mathbf{y}$.

FIGURE 14

| | GRAPPA | CS only | SpRING $\lambda = 1$ |
|---|---|---|---|
| 32-channel 128×128×128 3-D MPRAGE data | RMSE = 0.02063 | RMSE = 0.04024 | RMSE = 0.01690 |
| 32-channel 256×256×128 3-D MPRAGE data | RMSE = 0.02951 | RMSE = 0.03693 | RMSE = 0.02568 |
| 32-channel 240×256×176 3-D MPRAGE data | RMSE = 0.01603 | RMSE = 0.02415 | RMSE = 0.01456 |

SYSTEM FOR ACCELERATED MR IMAGE RECONSTRUCTION

This application claims priority of U.S. Patent Application 61/451,162 filed Mar. 10, 2011 by L. Grady et al. and is a continuation-in-part application of U.S. patent application Ser. No. 12/788,439 filed 27 May 2010 by L. Grady et al. claiming priority of Provisional U.S. Patent Application Ser. No. 61/181,312 filed 27 May 2009 by L. Grady et al.

This invention was made with government support under Grant Nos. DGE0645960 and CCF0643836 awarded by the National Science Foundation and under Grant No. R01 EB13007942 awarded by the National Institutes of Health. The government has certain rights in this invention.

FIELD OF INVENTION

The present invention relates to magnetic resonance imaging (MRI). More particularly, the present invention relates to parallel MRI image reconstruction.

BACKGROUND OF THE INVENTION

Magnetic resonance imaging (MRI) is a non-invasive diagnostic imaging procedure that uses nuclear magnetization and radio waves to produce internal images of a patient. The operation of an MRI scanner is well known but, briefly, an MRI scanner contains magnetic coils that create a strong static magnetic field in which the patient is positioned. Certain atoms in a patient's body that were previously randomly-ordered become aligned along the magnetic field. The scanner then sends a series of bursts or pulses of radio frequency (RF) energy through the patient's body part under examination that excite the "ordered" atoms to specific oscillations around the magnetic field. The atoms give up the RF energy, i.e., generate an RF signal, during the pulsed oscillations and as the atoms return to their respective alignments. The scanner detects the RF signals by appropriate reception or pick-up coils and uses gradient coils to generate non-homogeneous magnetic fields to enable the signals to be spatially coded in all three spatial directions. The scanner processes the coded signals or data to transform them into a visual representation of the scanned patient's body part. In particular, the scanner samples and digitizes the signals, creates a so-called k-space data matrix filled with the digitized complex values of each signal, and generates for display and/or other usage a corresponding MR image from the k-space data matrix by means of a complex Fourier transformation. The MRI scanner acquires three-dimensional image data of the patient's body part for respective "slices" of an area of the body part. The scanner repeats a pre-defined MR image pulse sequence, i.e., the above-described steps for collecting the signals/data, a number of times to collect sufficient data from the excitations to reconstruct the specific image. Ideally, there are little or no variations in the nuclear magnetization during the excitations. However, movement by the patient, voluntary or involuntary, is one of several conditions that may affect the nuclear magnetization and the subsequent MR image reconstruction.

MRI is an important imaging technique due to its flexibility and safety. However, there is a fundamental trade-off in MRI between acquisition time and image quality of the reconstructed images. In many circumstances, it is desirable to decrease the acquisition time so as to reduce the image artifacts resulting from the motion of the patient and from breathing or heart beating; to enable dynamic imaging; and to reduce overall examination times. Many techniques and technologies have been developed to improve image acquisition time.

Parallel imaging is a relatively new technique/technology that is designed to reduce the image acquisition time and has enabled many powerful improvements in routine clinical MRI; in particular, it enables dramatic acceleration of the MRI examination. Generally, an MRI scanner employing parallel imaging accomplishes this by obtaining spatial information from arrays of multiple independent radiofrequency (RF) coil detectors sampling data in parallel rather than from some portion of the spatial encoding which is performed using the gradient coils (typically the phase-encoding gradient). Only a fraction of the phase-encoding lines of image data is then acquired (i.e., under sampling k-space data) since phase encoding consumes much more time compared to the other location encodings. The MRI scanner applies a specialized reconstruction method to the acquired data to reconstruct the missing information, resulting in the full field-of-view (FOV) image in a fraction of the time. Many of the time-consuming image encoding steps can be skipped during the acquisition and then subsequently recovered in post-processing by exploiting the independent observations collected from each RF reception coil. This technique results in a significant decrease in the acquisition time, allowing for shorter examinations or for higher temporal sampling rates in dynamic imaging.

There are several parallel imaging reconstruction methods. One of the leading approaches for image reconstruction in parallel MRI is the GRAPPA method (this is more fully described in an article by M. A. Griswold, P. M. Jakob, R. M. Heidemann, N. Nittka, V. Jellus, J. M. Wang, B. Kiefer, and A. Haase, "Generalized autocalibrating partially parallel acquisitions (GRAPPA)", Magnetic Resonance in Medicine, 47:1202-1210, 2002). GRAPPA enables image reconstruction for accelerated acquisitions by estimating skipped k-space data through weighted combinations of raw k-space measurements across all channels in the RF receive coil array. Thereafter, the k-space data undergoes Fourier transformation. In contrast, compressed sensing (CS) image reconstruction techniques typically enable image reconstruction of accelerated acquisitions by examining and exploiting sparsity measures phrased in image space. Compressed sensing (CS) reconstructs images from each RF reception coil element with reduced FOV and then merges the images using knowledge of individual coil sensitivities.

Known systems attempt to mitigate the time-consuming nature of magnetic resonance imaging (MRI) processing. In Cartesian Fourier transform-based imaging, k-space is sampled at uniformly spaced intervals along the readout and phase-encode directions. Known systems use accelerated parallel imaging, where multiple receiver coils allow undersampled k-space acquisitions to produce images without aliasing. In addition, compressed sensing (CS) is applied in MRI to reduce the number of samples required to recover approximately sparse images. Given multiple receiver coils, several post-processing techniques, including SENSE (SENSitivity Encoding), SMASH (SMASH (SiMultaneous Acquisition of Spatial Harmonics), GRAPPA (Gene-Ralized Autocalibrating Partially Parallel Acquisition), and SPIR-iT, (Iterative Self-Contained Parallel Imaging reconstruction) synthesize un-aliased images from multi-coil undersampled data, in either k-space or the image domain. GRAPPA and SPIR-iT acquire several additional k-space lines, called autocalibration signal (ACS) lines, to form kernels for use in reconstruction. GRAPPA however assumes uniform undersampling. GRAPPA can be extended to non-uniform Cartesian subsampling at greater computational cost by using multiple kernels, one for each source/target pattern encountered. In contrast, SPIR-iT is another known accelerated parallel imaging system that accommodates non-uniform sampling patterns, since SPIR-iT uses the kernel to enforce consistency between a point in k-space and its neighborhood of k-space points, both acquired and unknown. The known systems reconstruct diagnostically useful images from undersampled data, however, at higher acceleration factors, GRAPPA especially tends to fail due to noise enhancement and unresolved aliasing. Also, SPIR-iT is more computationally intensive than GRAPPA for uniform undersampling.

Compressed sensing (CS) is a framework for reconstructing a sparse signal from fewer samples than is required according to classical sampling theory. A typical CS optimization problem involves minimizing the number of nonzero coefficients of a signal, while remaining consistent with observations. Direct interpretation yields a combinatorially hard problem, but greedy methods yield approximate solutions. One known system operates in the nullspace of an observation matrix (i.e. optimizes over the missing k-space values), preserving the data without the complexity of solving a constrained optimization problem. Known systems also apply CS to single-channel accelerated MRI reconstruction. Parallel imaging and compressed sensing are known methods for reconstructing images from accelerated MR image acquisitions. However, the combination of these two frameworks remains not fully explored.

CS-GRAPPA, CS-SENSE, and $L_1$ SPIR-iT combine parallel imaging methods (GRAPPA, SENSE, and SPIR-iT) with compressed sensing, however these combinations have substantial limitations. CS-GRAPPA combines CS and GRAPPA, alternatingly applying GRAPPA and CS reconstructions to fill missing k-space lines. The iterative structure of this method limits the synergy between sparsity (from CS) and multiple coils (from GRAPPA). CS-SENSE sequentially applies CS to each aliased coil image and combines the CS results using SENSE. Like SENSE, CS-SENSE is highly sensitive to the quality of the estimates of the coil sensitivity profiles. $L_1$ SPIR-iT jointly optimizes both for sparsity and for fidelity to a parallel imaging solution. However, $L_1$ SPIR-iT is computationally complex because the SPIR-IT kernel, unlike the GRAPPA kernel it replaces, needs to be applied repeatedly throughout the process, updating the k-space data for consistency instead of filling in the missing k-space data directly. It would be advantageous to jointly optimize both CS and GRAPPA error measures to produce reconstructed images that are consistent in both k-space and image space. A system according to invention principles combines GRAPPA with CS to improve quality and speed of accelerated MRI image reconstruction.

SUMMARY OF THE INVENTION

The above problems are obviated by the present invention which provides a method for reconstructing images of an imaged subject from a parallel MRI acquisition, comprising generating, for a response signal received by a respective RF reception coil, a complete dataset in k-space from a reduced k-space dataset of the response signal and associated weighting factors for the reduced k-space dataset; spatially transforming the complete k-space dataset generated to obtain an estimated reconstructed image for a respective RF reception coil; maximizing the sparsity of the estimated reconstructed images; repeating the generating and the spatially transforming steps using revised associated weighting factors obtained from each respective k-space dataset that results from the maximizing step; and combining the estimated reconstructed images for the respective RF reception coils to obtain a reconstructed image of the imaged subject. The generating step and the spatially transforming step may comprise using a generalized autocalibrating partially parallel acquisitions technique. In such case, or separately, the maximizing step may comprise using a compressed sensing technique. Also separately, the generating step may comprise deriving the associated weighting factors from reference calibration data for a respective reduced k-space dataset. Alternatively, the generating step may comprise deriving the associated weighting factors from reference calibration data that is obtained from a respective reduced k-space dataset. The generating step may comprise deriving the associated weighting factors from reference calibration data that is obtained from a respective reduced k-space dataset and the repeating step may comprise deriving the revised associated weighting factors from reference calibration data that is obtained from a respective complete k-space dataset that results from the maximizing step. Further, the maximizing step may comprise optimizing a sparsifying transform of an estimated reconstructed image over the set of values of the unacquired k-space data missing in the respective reduced k-space dataset. In such case, the generating step may comprise deriving the associated weighting factors from reference calibration data that is obtained from a respective reduced k-space dataset and the repeating step may comprise deriving the revised associated weighting factors from reference calibration data that is obtained from a respective complete k-space dataset that results from the maximizing step. Also, the maximizing step may comprise using a compressed sensing technique and may further comprise optimizing a sparsifying transform of an estimated reconstructed image over the set of values of the unacquired k-space data missing in the respective reduced k-space dataset. Also, the combining step may comprise combining the estimated reconstructed images using a sum of squares reconstruction to obtain a reconstructed image of the imaged subject.

The present invention may also provide a method for obtaining an image of a subject or sample by a parallel MR imaging device, comprising a) generating image reconstruction data from a generalized autocalibrating partially parallel acquisitions reconstruction of weighted under-sampled k-space data acquired by each RF reception coil of the device; b) calculating new weightings for respective under-sampled k-space data from k-space data obtained from a compressed sensing reconstruction of the image reconstruction data previously generated; and c) reconstructing the image according to the image reconstruction data generated from repeating the generating and calculating steps until convergence is achieved. In such case, the generating step may comprise deriving the weightings from calibration data that is obtained from respective under-sampled k-space data. Also, the compressed sensing reconstruction may obtain k-space data by maximizing the sparsity of a reconstructed image from the image reconstruction data generated. Alternatively, the compressed sensing reconstruction may obtain k-space data by optimizing a sparsifying transform of a reconstructed image over the set of values of the unacquired k-space data missing in the respective under-sampled k-space data. Also, the reconstructing step may comprise reconstructing using a weighted combination of the individual image reconstructions from each RF reception coil of the device.

The present invention may also provide a method for obtaining an image of a subject using parallel MR imaging, comprising a) generating image reconstruction data from a generalized autocalibrating partially parallel acquisitions (GRAPPA) reconstruction of weighted under-sampled k-space data acquired by each RF reception coil; b) generating image reconstruction data from a compressed sensing (CS) reconstruction of under-sampled k-space data acquired by each RF reception coil; c) reconstructing the subject image according to the image reconstruction data generated and the formula $$\min_{x} \|\Psi x\|_0 + \lambda \|\Psi x - CDW\bar{y}\|_2,$$

where x represents the pixel intensities of the reconstructed images for the RF reception coils; $\Psi$ represents a sparsifying transform; C represents a weighting matrix from the RF reception coils or the image estimates; D represents a block-diagonal matrix consisting of a discrete Fourier transform matrix; W represents a matrix operator that stores sets of weights which vary with the RF reception coils that may be applied to produce missing data in under-sampled k-space data; $\bar{y}$ represents the concatenated vector of the under-sampled k-space data from all the RF reception coils; and $\lambda$ represents a parameter to control the degree to which the formula solution indicates a GRAPPA or a CS solution.

The present invention may also provide a parallel magnetic resonance imaging apparatus comprising means for obtaining magnetic resonance image data of an imaged subject using a plurality of RF reception coils; means for generating in parallel a plurality of weighted reduced k-space datasets, which contain a fraction of the image data, from the magnetic resonance image data; and means for performing a generalized autocalibrating partially parallel acquisitions (GRAPPA) reconstruction of the weighted reduced k-space datasets acquired by the RF reception coils and combining the GRAPPA image reconstruction with a compressed sensing (CS) image reconstruction in an iterative approach or joint energy optimization approach to reconstruct the imaged subject according to the image reconstruction data.

An MR imaging system uses the multiple RF coils for acquiring corresponding multiple image data sets of the slice or volume. An image data processor comprises at least one processing device conditioned for generating a composite MR image data set representing a single image in a single non-iterative operation by performing a weighted combination of luminance representative data of individual corresponding pixels of the multiple image data sets in providing an individual pixel luminance value of the composite MR image data set. The image data processor reduces noise in the composite MR image data set by generating a reduced set of significant components in a predetermined transform domain representation of data representing the composite image to provide a de-noised composite MR image data set. An image generator comprises at least one processing device conditioned for generating a composite MR image using the de-noised composite MR image data set.

DESCRIPTION OF THE DRAWINGS

For a better understanding of the present invention, reference is made to the following description of an exemplary embodiment thereof, and to the accompanying drawings.

FIG. 13 shows pseudocode for a SpRING method, in accordance with the present invention.

FIG. 14 shows a table indicating root-mean-squared error (RMSE) for GRAPPA, CS, and SpRING reconstructions for three different MPRAGE datasets, each accelerated by a factor of R=4×4, using the same parameters as for a single slice performance comparison, in accordance with the present invention.

DETAILED DESCRIPTION OF THE INVENTION

A system accelerates magnetic resonance (MR) imaging beyond what is achievable using parallel imaging with GRAPPA (Generalized Autocalibrating Partially Parallel Acquisition) or compressed sensing (CS) alone using Sparse Reconstruction of Images employing a Nullspace method and GRAPPA (SpRING). The system adaptively selects an appropriate sparsifying transform and penalty function, and evaluates SpRING performance. The system optimizes trade-off between fidelity to a GRAPPA function and sparsity for different levels of acceleration.

Figure 1:
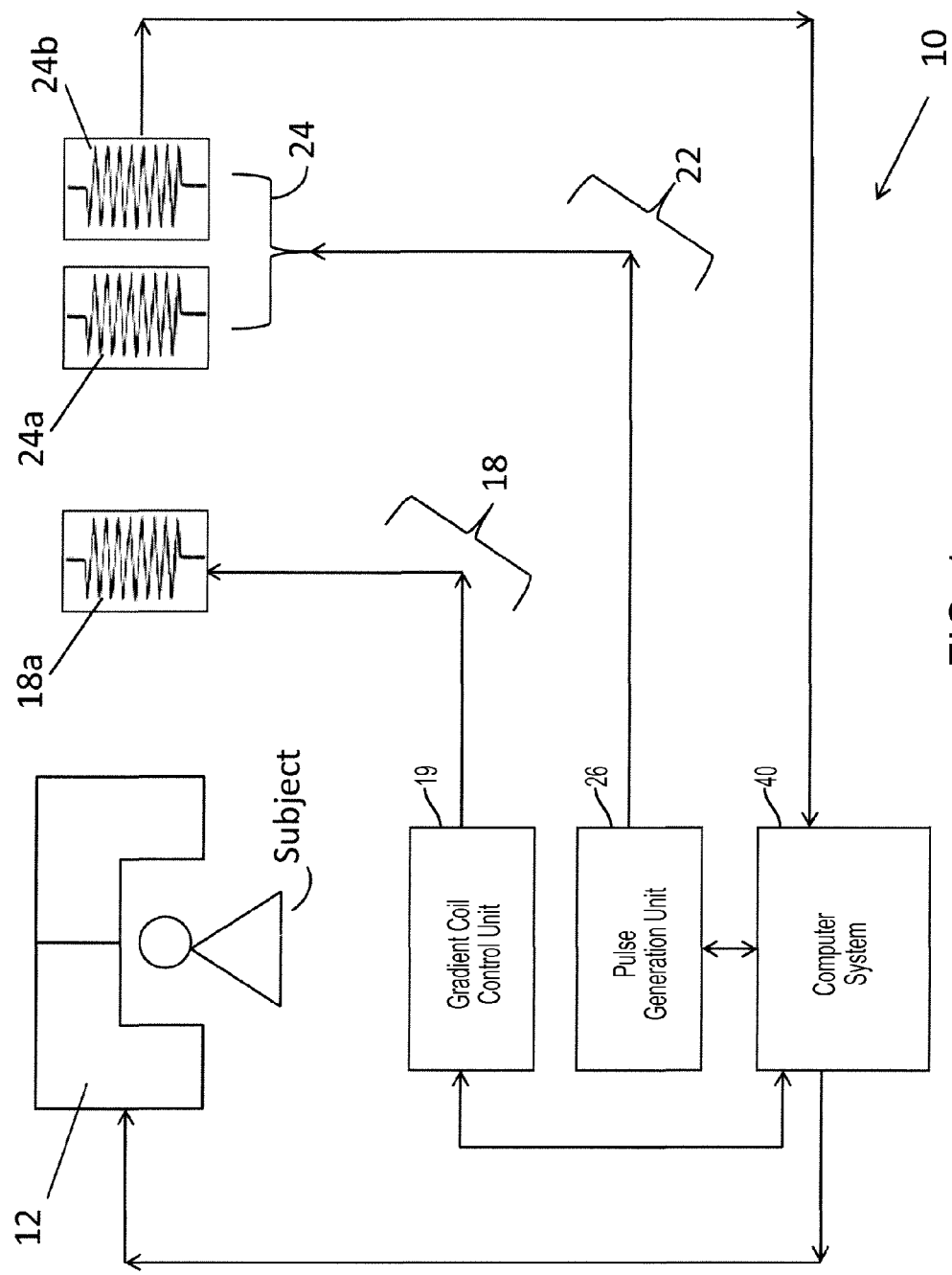
FIG. 1 is a block diagram of an MR scanner operable in accordance with the present invention.

FIG. 1 is a block diagram of a conventional MRI scanner 10 (simplified) that performs parallel MR image reconstruction in accordance with the present invention. A main magnet 12 generates a strong static magnetic field in an imaging region where the subject (i.e., patient or the specific body part of a patient to be examined) is introduced. The magnet 12 is used to polarize the patient's body part, i.e., certain atoms in the patient's body part that were previously randomly-ordered become aligned along the magnetic field. A gradient coil system 18, having a gradient coil subsystem 18a and a gradient coil control unit 19, generates a time-varying linear magnetic field gradient in respective spatial directions, x, y and z, and spatially encodes the positions of the polarized or excited atoms. An RF system 22, having an RF coil subsystem 24 and a pulse generation unit 26, transmits a series of RF pulses to the patient's body part to excite the "ordered" atoms of the patient's body part. The RF coil subsystem 24 may be adapted to switch between a transmission mode and reception mode and may comprise a RF transmission coil 24a and an RF reception coil arrangement/array 24b (which may have a plurality of reception coils and/or reception coil channels) that is capable of acquiring multiple channels of data in parallel.

A control or computer system 40 coordinates the pulse generation unit 26, the gradient coil control unit 19, and other components to carry out a desired MR image pulse sequence. The scanner 10 repeats the MR image pulse sequence a number of times so the atoms oscillate around the polarized alignment direction (along the main magnetic field) during the excited state caused by the energy of RF pulses. The atoms release the RF energy, i.e., generate an RF signal, during the resonance or oscillation and as the atoms return to their respective alignments. The RF coil system 24 detects the released RF energy, via the RF reception coil arrangement/array 24a, and generates spatially-coded MR signals to the computer system 40.

Figure 2:
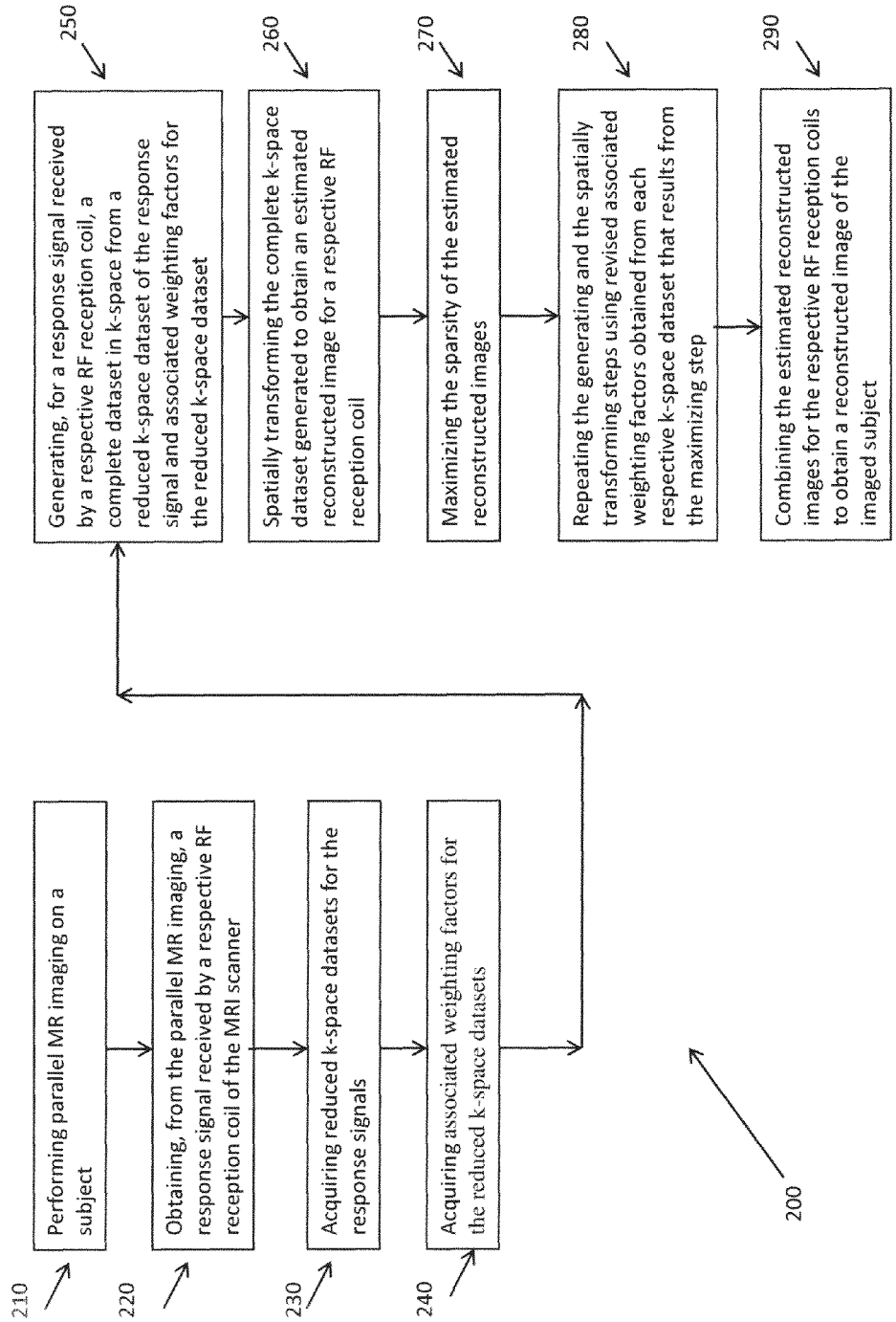
FIG. 2 is a flow chart of a first method of operation by the MR scanner of FIG. 1 in accordance with the present invention.
Figure 3:
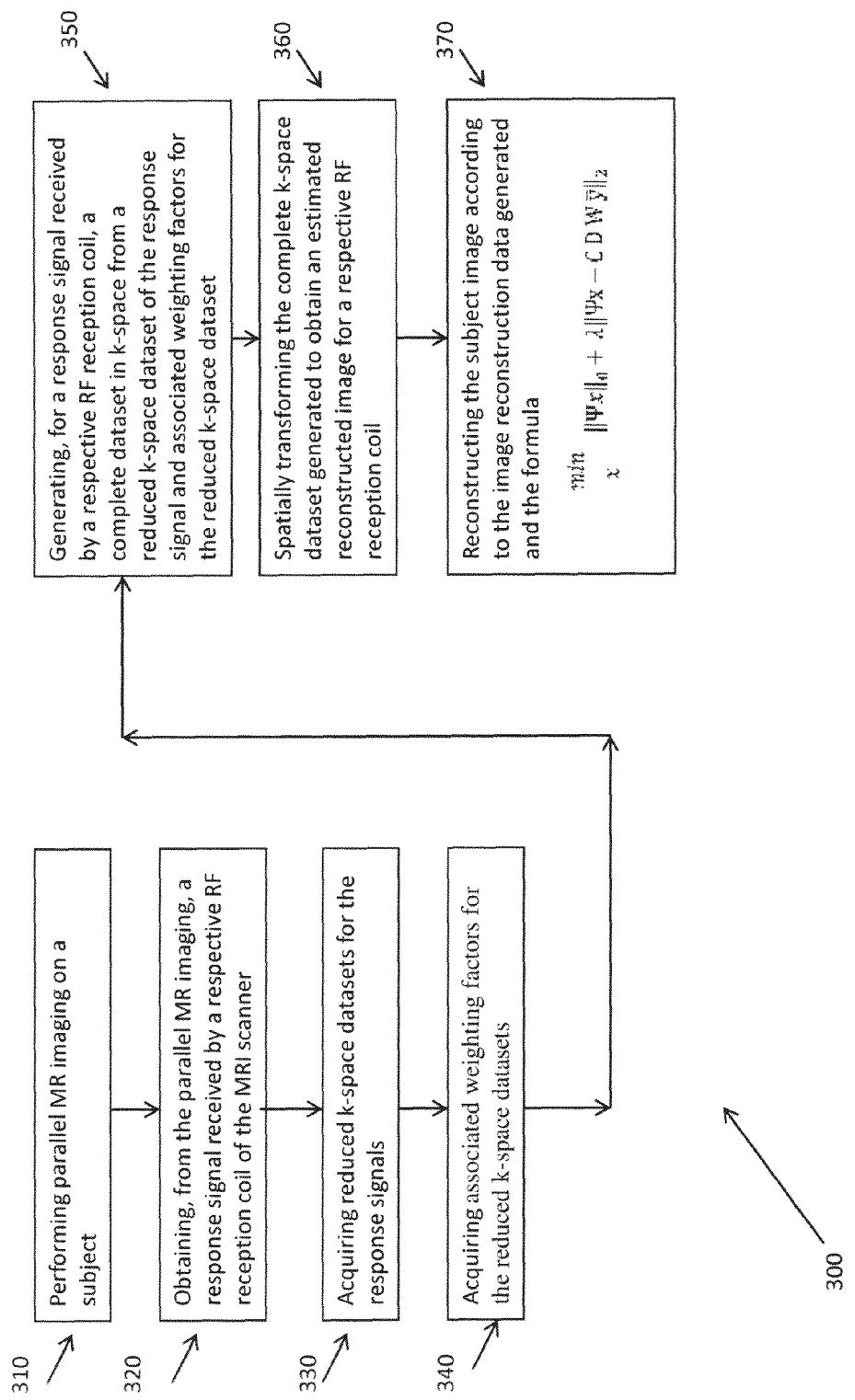
FIG. 3 is a flow chart of a second method of operation by the MR scanner of FIG. 1 in accordance with the present invention.

The computer system 40, which controls the operation of the MR scanner 10 and its components, processes the MR signals to transform them into a visual representation of the patient's body part (i.e., reconstructed MR images). In particular, the computer system 40 digitizes the signals, constructs a k-space data matrix filled with the digitized complex values of each signal, and generates for display, storage, and/or other usage a corresponding MR image from the k-space data matrix using well-known mathematical techniques, such as a complex Fourier transformation. Movements by the patient in the imaging region are likely to affect the nuclear magnetization and image reconstruction. To reduce the acquisition time of the reconstructed images (and thus increase the image quality), among other purposes, the MR imaging system 10 is adapted to operate according to methods of the present invention as shown in FIGS. 2 and 3.

Imaging system 10 includes a system for parallel image processing in MR imaging including multiple MR imaging RF coils 24 for individually receiving MR imaging data representing a slice of patient anatomy. MR imaging system 10 uses multiple RF coils 24 for acquiring corresponding multiple image data sets of the slice. An image data processor in computer system 40 and not shown (to preserve drawing clarity) comprises at least one processing device conditioned for, generating a composite MR image data set representing a single image in a single non-iterative operation by performing a weighted combination of luminance representative data of individual corresponding pixels of the multiple image data sets in providing an individual pixel luminance value of the composite MR image data set. The at least one processing device reduces noise in the composite MR image data set by generating a reduced set of significant components in a predetermined frequency domain representation of data representing the composite image to provide a de-noised composite MR image data set. An image generator in computer system 40 and not shown (to preserve drawing clarity) comprises at least one processing device conditioned for generating a composite MR image using the de-noised composite MR image data set.

As noted above, the GRAPPA algorithm is a well-known auto-calibrated image reconstruction method that estimates missing k-space data for a given RF reception coil from weighted linear combinations of acquired data across all coils in the RF reception coil array. The weights are derived from fully-sampled reference data referred to as "Auto-Calibration Signals" or ACS data. To better understand the following summarized description of the GRAPPA approach, certain notation for describing the image reconstruction is first discussed. Let x represent the pixel intensities of the reconstructed image. Let $\bar{y}_i$ represent the acquired data from an RF reception/target coil i and let n represent the number of coil channels. Let F represent the discrete inverse Fourier transform matrix, and let the concatenation $y_i = |\bar{y}_i; \hat{y}_i|$ represent the full k-space data at an RF reception/target coil i (i.e., the acquired data in $\bar{y}_i$ and the missing data in $\hat{y}_i$).

Briefly, the GRAPPA approach for reconstructing an image begins by generating a set of weights stored in a matrix operator $W_{i,j}$, which varies with an RF source coil j and an RF target coil i, that may be applied to produce the missing data in k-space. Specifically, given an operator $W_{i,j}$, a complete set of k-space information for an RF reception/target coil i may be produced as $$y_i = \sum_{j=1}^{n} W_{i,j} \bar{y}_j. \tag{1}$$

Given the full k-space data $y_i$, for each RF target coil i, an estimate of the reconstructed image $p_i$ for an RF target coil i may be produced via $$p_i = F y_i = F W_{i,j} \bar{y}_j. \tag{2}$$

The final image is then formed from a weighted linear combination of the individual image reconstructions, $$x = \sum_{i=1}^{n} c_i p_i. \tag{3}$$

The weighting matrix $c_i$ is diagonal and the weighting coefficients could be generated with any method. Common approaches to finding a weighting matrix are to derive the diagonal elements of the weighting matrix $c_i$ from the coil sensitivity profiles, or from the individual coil image estimates themselves as in the standard root-sum-of-squares combination method.

The notation is adopted herein that any coil-associated variable without a subscript indicates a concatenated vector of all coils in the RF coil array, e.g., $$y = |y_1; y_2, \ldots ; y_n|, \tag{4}$$

$$C = |C_1; C_2, \ldots ; C_n|$$

or $$W = \begin{bmatrix} W_{1,1} & \cdots & W_{1,n} \\ \vdots & \ddots & \vdots \\ W_{n,1} & \cdots & W_{n,n} \end{bmatrix}.$$

Equation 3 indicated above may therefore be rewritten in matrix form as $$x = Cp. \tag{5}$$

Consequently, the entire reconstruction process using the GRAPPA method can be rewritten in matrix form as $$x = Cp = CDy = CDW\bar{y} \tag{6}$$

where D is a block-diagonal matrix consisting of the DFT matrix F on each block defined as $$D = \begin{bmatrix} F & 0 & \cdots & 0 \\ 0 & F & & 0 \\ \vdots & & \ddots & \vdots \\ 0 & 0 & \cdots & F \end{bmatrix} \quad (7)$$

Also, as noted above, compressed sensing (CS) is a well-known approach to image reconstruction that attempts to maximize the sparseness (i.e., the number of zero values) of a sparsifying operator acting on the reconstructed image. A summarized description only is provided herein. Specifically, given data acquisition constraints, a compressed sensing (CS) approach to image reconstruction constrained on an accelerated or under-sampled k-space acquisition would be formulated as the solution to the optimization problem, $$\min \|\Psi x\|_0$$

$$\text{s.t.} F_A^T p_i = \bar{y}_i, \forall i \quad (8)$$

where $\Psi$ represents some sparsifying transform such as the image gradient or wavelet basis (more fully described in an article by M. Lustig, D. L. Donoho, and J. M. Pauly, "Sparse MRI: The application of compressed sensing for rapid MR imaging", Magnetic Resonance in Medicine, 58(6): 1182-1195, Dec. 2007), $F_A$ represents the portion of the inverse DFT matrix corresponding to the acquired set of k-space data A, and $F_A^T$ represents the corresponding forward DFT matrix. Since Equation 8 is NP-Hard, practical optimization of Equation 8 may be performed via approximation of the norm $\|\cdot\|_0$ by $\|\cdot\|_1$ (more fully described in the Lustig, et al, article above) or by an iterative re-weighted approximation of $\|\cdot\|_0$ (more fully described in an article by J. Trzaska, A. Manduca, and E. Borisch, "Robust kernel methods for sparse MR image reconstruction", In N. Ayache, S. Ourselin, and A. Maeder, editors, *Proc. Of MICCAI* 2007, volume Part 1 of *LNCS*, pages 809-816. Springer-Verlag, 2007). The term NP-Hard is well understood from the computational complexity field as an abbreviation for the term "non-deterministic polynomial-time hard" which signifies a class of problems that are at least as hard as the hardest problems in the NP set of decision problems. Also, Equation 8 is a nonconvex optimization, thus the initial solution for x will have an impact on the final solution obtained via any descent procedure.

The constrained optimization in Equation 8 may be replaced by an unconstrained optimization in the nullspace of the constraints. Specifically, since the nullspace variables correspond to the unacquired k-space data $\hat{y}$ for each RF target coil, Equation 8 may be rewritten as an unconstrained optimization over such data $\hat{y}$ in the form:

$$\min_{\hat{y}} \|\Psi C(D_A \bar{y} + D_{\bar{A}} \hat{y})\|_0 \quad (9)$$

where $\bar{A}$ indicates the set complement of A and $D_A$ is used to indicate the block diagonal matrix consisting of blocks of $F_A$.

The nullspace approach to compressed sensing (CS) presented above is directly compatible with the GRAPPA formalism in that both approaches estimate missing k-space data to remove aliasing in the image domain due to undersampling under the constraint that the original, acquired k-space data is not altered in the process. The present invention exploits this commonality and provides methods to combine the two approaches to reconstruct MR images.

FIG. 2 shows one method of operation 200 of the MRI scanner 10 in accordance with the present invention. Briefly, the MRI scanner 10 performs parallel MR imaging on a subject (step 210) and obtains response signals from the RF reception coils in the RF reception coil arrangement/array 24a in parallel (step 220). The MRI scanner 10 processes the response signals to obtain k-space datasets for the RF reception coils. However, the MRI scanner 10 only samples/collects or acquires a fraction of the raw image data (usually a fraction of the phase-encoding lines of the k-space datasets), i.e., it acquires reduced or under-sampled k-space datasets (step 230).

The MRI scanner 10 then applies a reconstruction method according to the present invention to the parallel MRI acquisition data to reconstruct the missing information and the images of the imaged subject. In particular, the MRI scanner 10 uses a reconstruction algorithm that combines the GRAPPA method and the compressed sensing (CS) method in an iterative approach that alternates the solutions of Equations 9 and 2. Specifically, the algorithm undertakes the following steps. First, the algorithm performs a GRAPPA reconstruction to estimate a complete set of k-space information $y_i$ for each RF reception/target coil i (step 250). More specifically, the algorithm uses ACS training data to calculate matrices $W_{i,j}$ across all RF source coils j (step 240) and solves Equation 2 to obtain an initial solution $\hat{y}_i$ for an RF target coil i, following the standard GRAPPA procedure (step 260).

The algorithm performs the next steps until convergence is achieved. Given the current set of estimated k-space data $y_i$ for an RF target coil i, the algorithm maximizes sparsity in the reconstructed image x by optimizing Equation 9 for $\hat{y}$ (step 270). Next, using the solution obtained from optimizing Equation 9, the algorithm calculates new weight matrices $W_{i,j}$ with the standard GRAPPA fitting approach, except that the $W_{i,j}$ values are computed using the full set of estimated k-space data obtained from the compressed sensing (CS) optimization of Equation 9 rather than the initial set of ACS lines (step 280). The MRI scanner 10 combines the estimated reconstructed images for the respective RF reception coils to obtain a reconstructed image of the imaged subject (step 290).

FIG. 3 shows another method of operation of the MRI scanner 10 in accordance with the present invention. Similarly described above, the MRI scanner 10 performs parallel MR imaging on a subject (step 310) and obtains response signals from the RF reception coils in the RF reception coil arrangement/array 24a in parallel (step 320). The MRI scanner 10 processes the response signals to obtain k-space datasets for the RF reception coils. However, the MRI scanner 10 only samples/collects or acquires a fraction of the raw image data (usually a fraction of the phase-encoding lines of the k-space datasets), i.e., it acquires reduced or under-sampled k-space datasets (step 330).

The MRI scanner 10 then applies a reconstruction method according to the present invention to the parallel MRI acquisition data to reconstruct the missing information and the images of the imaged subject. In particular, the MRI scanner 10 uses a reconstruction algorithm that combines the GRAPPA method and the compressed sensing (CS) method to produce a joint optimization of the GRAPPA energy and the compressed sensing (CS) energy. Similar to the iterative approach, the algorithm performs a GRAPPA image reconstruction to estimate a complete set of k-space information $y_i$ for each RF reception/target coil i (step 350). The algorithm uses ACS data to calculate matrices $W_{i,j}$ across all RF source coils j (step 340) and solves Equation 2 to obtain an initial solution $\hat{y}_i$ for an RF target coil i, following the standard GRAPPA procedure (step 360).

Specifically, the image reconstruction using the joint optimization approach then is a solution to the problem $$\min_x \|\Psi x\|_0 + \lambda \|\Psi x - CDW\bar{y}\|_2 \quad (10)$$

This can be alternately written in terms of the variables $\hat{y}$ as the following:

$$\min_{\hat{y}} \|\Psi C(D_A \bar{y} + D_{\bar{A}}\hat{y})\|_{0+\lambda} \|C(D_A \bar{y} + D_{\bar{A}}\hat{y}) - CDW\bar{y}\|_2 \quad (11)$$

Finding a minimum to Equation 11 is NP-Hard, but an efficient optimization of Equation 11 may be found by approximating the $\|\Psi x\|_0$ term to either $\|\Psi x\|_1$ or the successive robust functions (i.e., $\|\Psi x\|_0 \approx \sigma(\Psi x)$ as suggested in the Trzaska, et al. article above. The parameter $\lambda$ may be used to control the degree to which the solution resembles the GRAPPA reconstruction (i.e., high $\lambda$ value) or the compressed sensing (CS) solution (i.e., low $\lambda$ value).

System 10 (FIG. 1) combines GRAPPA with CS to improve quality and speed of accelerated MRI image reconstruction and advantageously applies GRAPPA reconstruction once, for substantial computational saving. The system obtains improved image reconstruction from a reduced data set that is smaller than achievable with either multiple receiver coils or CS alone and provides an estimate of the missing k-space lines from multiple coils of undersampled data. The system utilizes a combination of a nullspace parameterization of CS, GRAPPA, and a nonconvex sparsity penalty function and accommodates uniform Cartesian sampling patterns and can be implemented without increased complexity and more efficiently than $L_1$ SPIR-iT, for example.

The system reconstructs images from a sparse parallel acquisition and is implemented on a computational device (e.g., a computer, laptop, cell phone, DSP) which electronically reads the stored inputs (the sparse, k-space acquisition data from multiple RF receiver coils), performs the computations described herein and writes the reconstructed image(s) to an electronic storage media (e.g., a hard drive, data server, portable storage device) or a display in system 10.

In one embodiment, system 10 employs a method for Sparse Reconstruction of Images using the Nullspace method and GRAPPA (SpRING) method, that extends the nullspace formulation for CS to jointly optimize with a GRAPPA fidelity penalty, balancing the sparsity of the image with the quality of the GRAPPA reconstruction. The effects of a selected configuration are evaluated, including a continuation scheme, sparsifying transform, sparsity penalty function, and nullspace formulation. The method is compared against GRAPPA and CS alone, to measure the additional improvement from combining the accelerated image reconstruction and is also compared against $L_1$ SPIR-iT.

Brain images reconstructed from undersampled k-space data using SpRING are compared against reconstructions using existing methods in terms of root mean squared error (RMSE), difference images, and noise amplification (g-factors) as measured using a pseudo-multiple replica method. In experiments presented, several choices of sparsifying transform and penalty function do not significantly alter the performance of SpRING, while the choice of continuation and tuning parameters substantially affects the result. For several brain images, the RMSE is reduced by 10-20% at 4×4 acceleration using SpRING, compared to using GRAPPA or CS alone. The SpRING system provides a substantially reduced computational burden and improved speed in comparison with the $L_1$ SPIR-iT method and reduces noise amplification compared with GRAPPA or $L_1$ SPIR-iT as evidenced by measured g-factors.

The canonical CS problem of recovering a sparse signal y from observations d is $$\min_y \|\Psi F^{-1} y\|_0 \quad \text{s.t.} \quad d = Ky, \quad [12]$$

where $F^{-1}$ is the inverse DFT, $\Psi$ is the sparsifying forward transform, and the $l_0$ "norm" is the number of nonzero elements of the coefficient vector $\|w\|_0 = \Sigma_n 1(w_n \neq 0)$. The indicator function $1(w_n \neq 0)$ is defined to equal one whenever $w_n \neq 0$ and zero when $w_n = 0$. K is the subsampling matrix selecting the observed points out of the full k-space. Also yielding a sparse solution is the convex relaxation of the optimization problem:

$$\min_y \|\Psi F^{-1} y\|_1 \quad \text{s.t.} \quad d = Ky. \quad [13]$$

Additionally, efficient methods for certain nonconvex relaxations like $l_p$ penalty (p<1), use differentiable Welsch error function $\|w\|_{S(\alpha)} = \Sigma_n 1 - \exp(-\alpha|w_n|^2)$ and the Cauchy error function $\|w\|_{S(\alpha)} = \Sigma_n \log(1+\alpha|w_n|^2)/\log(1+\alpha)$. The nullspace formulation of the CS framework with general sparsity penalty function $\|w\|_{S(\alpha)}$ is an unconstrained optimization problem formed by taking the nullspace decomposition of y with respect to the subsampling matrix K; here ($K^c$) is the complement of the subsampling matrix K, selecting the missing k-space data x:

$$\min_x \|\Psi F^{-1}(K^T d + (K^c)^T x)\|_{S(\alpha)}; y = K^T d + (K^c)^T x. \quad [14]$$

This problem is repeated for an increasing sequence of values for the parameter $\alpha$, improving the objective's approximation to the $l_0$ sparsity penalty function. This method of approaching the $l_0$ penalty, called homotopy continuation, is used to solve ill-conditioned or intractable optimization problems.

The nullspace formulation of the data-equality constrained CS framework is extended to the multi-coil case by enforcing simultaneous sparsity across the coils through solving $$\min_x \|\Psi F^{-1}(K^T d + (K^c)^T x)\|_{S(\alpha)}. \quad [15]$$

The sparsity penalty function $\|\cdot\|_{S(\alpha)}$ first computes the root-sum-square across the coils for each sparse coefficient separately and computes the sparsity penalty of the vector of resulting magnitudes. The resulting multi-channel reconstructed images are combined as a post-processing step by the image data processor using per-pixel linear coil-combination weights C that are computed from an estimate of the coil sensitivity profiles. Due to the known smoothness of coil sensitivity profiles, this estimate is computed from low-resolution data and the ACS lines already used for computing the GRAPPA kernel, Based on known formulation of the multi-channel SNR equation, the coil combination weights are computed to be "signal normalized," i.e. the gain is unity. In particular, the weights that combine the data across channels are used such that the resulting SNR is optimized:

$$[C_1(x,y,z) \ldots C_P(x,y,z)] = \qquad [16]$$

$$\left( \begin{bmatrix} S_1(x,y,z) \\ \vdots \\ S_P(x,y,z) \end{bmatrix}^H \Lambda^{-1} \begin{bmatrix} S_1(x,y,z) \\ \vdots \\ S_P(x,y,z) \end{bmatrix} \right)^{-1} \begin{bmatrix} S_1(x,y,z) \\ \vdots \\ S_P(x,y,z) \end{bmatrix}^H \Lambda^{-1}$$

where $S_p(x,y,z)$ are the coil sensitivity estimates, and $\Lambda$ is the measured coil noise covariance matrix. Each pixel of the combined image is formed by multiplying the vector $[C_1(x,y,z), \ldots, C_P(x,y,z)]$ by the stacked vector of the corresponding pixel in all of the coil images.

The k-space value at frequency k encoded by the pth coil is denoted as $y_p(k)$, the frequency spacing corresponding to full-FOV sampling is $\Delta k$, the number of coils is P, and the number of nearby known lines used to approximate a missing line is B. In GRAPPA, the missing data is recovered using $$y_p(k + r\Delta k) = \sum_{b=1}^{B} \sum_{q=1}^{P} g_{b,q}^{(p,r)} y_q(k + (b - \lceil B/2 \rceil)R), \qquad [17]$$

where the kernel coefficients $g_{b,q}^{(p,r)}$ are computed from a least-squares fit using the ACS lines. Combining these equations over fully-sampled k-space y for all the coils yields y=Gd, where d represents the acquired k-space data, and G is the kernel operator. SPIR-IT uses a different kernel, denoted $G_S$ to differentiate from the GRAPPA kernel, to form consistency equations for points in the full k-space with its neighbors and organizes the resulting consistency equations into the constrained optimization problem $$\min_{y} \|(I - G_S)y\|_2^2 \text{ s.t. } \|d - Ky\|_2^2 \leq \varepsilon, \qquad [18]$$

or the unconstrained version with tuning parameter $\lambda$, $$\min_{y} \|(I - G_S)y\|_2^2 + \lambda \|d - Ky\|_2^2. \qquad [19]$$

When preserving the acquired data ($\varepsilon=0$), the SPIR-iT optimization problem is conveniently expressed using the nullspace method previously applied to the CS framework:

$$\min_{x} \|(I - G_S)(K^T d + (K^c)^T x)\|_2^2. \qquad [20]$$

The SPIR-iT optimization problem, when augmented with $l_1$ norm-based regularization to promote sparsity, becomes $L_1$ SPIR-iT.

In order to incorporate GRAPPA, a least-squares term is added to the objective function to improve fidelity to the GRAPPA k-space result. Let G represent the operation of applying GRAPPA to fill k-space, the optimization problem becomes $$\min_{x} \|CF^{-1}(K^T d + (K^c)^T x - Gd)\|_2^2 + \lambda \|\Psi F^{-1}(K^T d + (K^c)^T x)\|_{S(\alpha)}. \qquad [21]$$

Here C is a diagonal matrix of the coil-combination weights, but these weights are used in the GRAPPA fidelity term to weight the pixels in the per-coil images, not to combine them. Since more important pixels should have less noise, the image-domain pixels are weighted by their contributions to the final combined image, but the coil-by-coil nature of GRAPPA is preserved. The tuning parameter $\lambda$ is advantageously introduced to control the relative importance of GRAPPA fidelity and sparsity; the proper choice of $\lambda$ depends on the degree of sparsity of the combined image and the noise enhancement due to GRAPPA. In addition to combining CS and GRAPPA, it is recognized that the optimization problem formulation indicates that this combination can also be viewed as using CS to regularize GRAPPA, so the resulting reconstruction is expected to be less noisy than GRAPPA alone when CS is performed with a de-noising transform like the wavelet.

In order to perform optimization, a known iteratively reweighted least squares (IRLS) method, for example, is applied in conjunction with least-squares solver LSMR. Taking the derivative of the objective function yields $$\lambda K^c F^{-H} \Psi^H D_\alpha (\Psi F^{-1}(K^T d + (K^c)^T x)) \Psi F^{-1}(K^T d + (K^c)^T x) \ldots + \qquad [22]$$
$$K^c F^{-H} C^H C F^{-1}(K^T d + (K^c)^T x - Gd) = 0,$$

where $$D_\alpha(w) = \text{diag}\left( \frac{1}{w_1} \frac{\partial \|w\|_{S(\alpha)}}{\partial w_1}, \ldots, \frac{1}{w_n} \frac{\partial \|w\|_{S(\alpha)}}{\partial w_n} \right)$$

is a diagonal weight matrix. Rearranging yields the linear system $A^H A x = A^H b$, where $$A = \begin{bmatrix} \sqrt{\lambda} D_\alpha(w)^{1/2} \Psi F^{-1}(K^c)^T \\ CF^{-1}(K^c)^T \end{bmatrix}, \qquad [23]$$

$$\text{and } b = \begin{bmatrix} -\sqrt{\lambda} D_\alpha(w)^{1/2} \Psi F^{-1} K^T d \\ CF^{-1}(G - K^T)d \end{bmatrix}.$$

The IRLS method comprises fixing the diagonal weight matrix, solving the resulting linear system using LSMR, re-computing the weight matrix for the new vector x, and repeating until convergence. Solving the normal equations $A^H A x = A^H b$ using LSMR involves use of efficient matrix-vector multiplications Ax and $A^H y$ to compute for arbitrary vectors x and y.

Multiple configuration selections are made, A sparsifying transform and sparsity penalty function are determined. The continuation strategy, connected to the penalty function, is controlled by selected parameters. Brain MR images are typically not sparse, they contain a large quantity of data of various magnitudes. Nevertheless, empirical evidence suggests that a wavelet or finite-differences transform yields representations with improved sparsity for many types of MRI data, including brain images. Known multi-scale multi-orientation transforms like a curvelet, contourlet, or shearlet may also yield approximately sparse representations. However, overcomplete transforms are not ideal to include with the nullspace formulation since a single image has many approximate transform-domain representations with differing degrees of sparsity.

An appropriate sparsity penalty function is chosen. The $l_1$ norm is convex and involves no continuation, a nonconvex sparsity prior like the $l_p$ (p<1) penalty function or the Gaussian penalty function may improve the sparsity of the result. In addition, to better approximate the $l_0$ exact sparsity penalty function, the $l_p$ or Gaussian penalty functions are combined with continuation in one embodiment to yield successively more sparse reconstructions as p is decreased or $\alpha$ is increased.

In applications of SpRING, data is acquired system 10 (FIG. 1) using a uniform subsampling of Cartesian k-space. A small set of ACS lines are acquired and are used to compute a 3×3 GRAPPA kernel, to estimate coil sensitivity profiles, and as known data in the reconstruction. Before computing the sensitivity profiles, the ACS lines are apodized using a window (e.g. a Blackman window) that attenuates the sidelobes of the implicit low-pass filter present in k-space, thus reducing the effects of low-resolution blurring on the profile estimates. To compute the noise covariance matrix used in forming coil combination weights, a noise acquisition with no RF excitation is collected before the main acquisition; the noise covariance matrix is computed using the sample covariance across the coils of the samples of the noise acquisition.

Once data is acquired, slices orthogonal to the readout direction are reconstructed individually using the SpRING system, using parameters appropriate for the acquisition. The optimization problem is solved using iteratively reweighted least squares (IRLS), combined with least-squares solver LSMR for inverting linear systems. Continuation involves repeating IRLS with different weights for the increased $\alpha$'s.

FIG. 13 shows pseudocode for a SpRING method according to invention principles. Each inner iteration of LSMR (steps 4 and 5 of the pseudocode) involves two FFTs, a fast sparsifying transform, and its transpose, as well as multiplication by the diagonal weight matrices or the subsampling matrices. Also, b (on the right side of the normal equation of step 4) is re-computed when the weight matrix changes. An aggressive continuation schedule, where the IRLS method stops for smaller $\alpha$, ensures that the overall method complexity is comparable to existing CS reconstruction methods.

To evaluate a configuration and conduct performance simulations, a full-FOV 3-D dataset is acquired using an unaccelerated $T_1$-weighted MPRAGE (256×256×176 sagittal, 1.0 mm isotropic) sequence on an imaging system with a 32-channel head coil array at 3 T, for a total acquisition time of 8 minutes, for example. A 2-D axial slice is extracted from this high-SNR acquisition and cropped; this cropped image is used as the ground-truth. To generate the reduced-FOV data, this slice is undersampled in both directions in k-space. A 36×36 block (not undersampled) at the center of k-space is retained as the ACS lines used in the reconstructions. This data is processed using the different reconstruction functions implemented in MATLAB. Each reconstructed image is evaluated qualitatively by generating a difference image and quantitatively by computing a root-mean-squared error (RMSE). Both the difference images and the RMSE measurements are computed from magnitude images.

Implementation of continuation-based approximation of the $l_0$ sparsity penalty using a Cauchy penalty or other nonconvex function is examined. The scale factor a of the Cauchy penalty function controls the sharpness of the penalty function. A larger value of $\alpha$ yields a sharper penalty function, closer to the $l_0$ sparsity penalty function. However, a configuration is selected including initial and maximum values for $\alpha$, a method for increasing $\alpha$, and convergence criteria for determining when to increase $\alpha$. The initial value of $\alpha$ is sufficiently small to minimize the effects of nonconvexity causing the IRLS method to converge to undesirable local minima; for the scale of values in the acquired data, $\alpha=1$ is not too large. The large value of $10^8$, for example, is chosen for $\alpha_{max}$, to ensure the continuation does not terminate early. However, smaller values of $\alpha_{max}$ are examined to reduce the computation time and oversmoothing. For simplicity, $\alpha$ is increased by a constant multiplicative factor,) $\beta$, whenever the inner IRLS loop appears to converge. Convergence is measured by comparing values of the objective function for successive iterations of the IRLS method against a tolerance threshold.

The choices of sparsifying transform and penalty function depend on the nature of the data to be sparsified. The SpRING method is applied to a slice of the acquired data using wavelet (DWT), finite differences, and curvelet transforms. Since the sparsifying transform and sparsifying penalty function are closely connected, both the $l_1$ norm and the Cauchy penalty function (the latter with continuation as specified in previously) are used when evaluating each sparsifying transform. Quantitative and qualitative comparisons of different combinations of sparsifying transform and penalty function, including computation time, are determined as shown later. A sparse transform domain (or sparse domain) refers to a representation of a signal using a set of coefficients such that a small proportion of those coefficients are not negligible. A coefficient is negligible if replacing that coefficient value with zero does not perceptibly modify signal (image) content.

A further configuration selection is associated with the combination of CS and GRAPPA, specifically a determination of how much sparsity is valued relative to a GRAPPA result. The sparsity penalty can be viewed as regularization, as it de-noises the GRAPPA reconstruction. Since the noise amplification of GRAPPA, and accelerated parallel imaging is tied to the undersampling factor, the choice of tuning parameter, $\lambda$, also is tied to R. In an experiment, SpRING is run for a coarse range of $\lambda$ from $10^a$, for a=−5, −4, . . . , 5, and 6; GRAPPA ($\lambda=0$) and the CS ($\lambda=\infty$) results are also computed. To illustrate the trend in acceleration factor, this is repeated for R=3×3, 4×3, 4×4, 5×4, 5×5, and 6×6 uniform acceleration. For each acceleration factor, the process is repeated for densely-spaced $\lambda$ to determine the best value. To decrease the number of $\lambda$'s to evaluate, the search range is guided by the coarse processing.

To evaluate the performance of SpRING, the implementation with the DWT (4-level 9-7 wavelet) sparsifying transform and Cauchy penalty function with continuation is compared against GRAPPA, CS alone, and $L_1$ SPIR-IT. The $L_1$ SPIR-iT method is selected. Various sizes of the SPIR-iT kernel are simulated, but little difference is observed between them; a 7×7 kernel is used here.

Geometry factors (g-factors) describe the noise amplification of a reconstruction method due to the geometry of the coils (a factor beyond the factor of R loss of SNR due to undersampling k-space). For a linear method like GRAPPA or SENSE, the noise amplification should also be linear, so the g-factors depend on the sampling pattern/acceleration factor. Also, the g-factors may be computed analytically for GRAPPA. For nonlinear methods, the SNR loss depends on the input noise level, so g-factors are valid in a small range around that noise level. While the RMSE captures sources of error, including blurring and aliasing, g-factors primarily capture noise amplification. To compute the g-factors for GRAPPA, CS alone, $L_1$ SPIR-iT, and SpRING, 400 Monte Carlo trials are used. The noise amplifications from each simulation are averaged, and the resulting values are combined across coils using the coil combination weights used to form the combined image. The parameters for each of the reconstruction methods are identical to those used in the preceding performance evaluations. In each trial, zero-mean additive white Gaussian noise (AWGN) is added to the k-space data before performing reconstructions. The noise covariance $\Lambda_{AWGN}$ is chosen to be the same as the noise covariance matrix $\Lambda$ observed for the acquisition. This method for computing g-factors is known.

Figure 4:
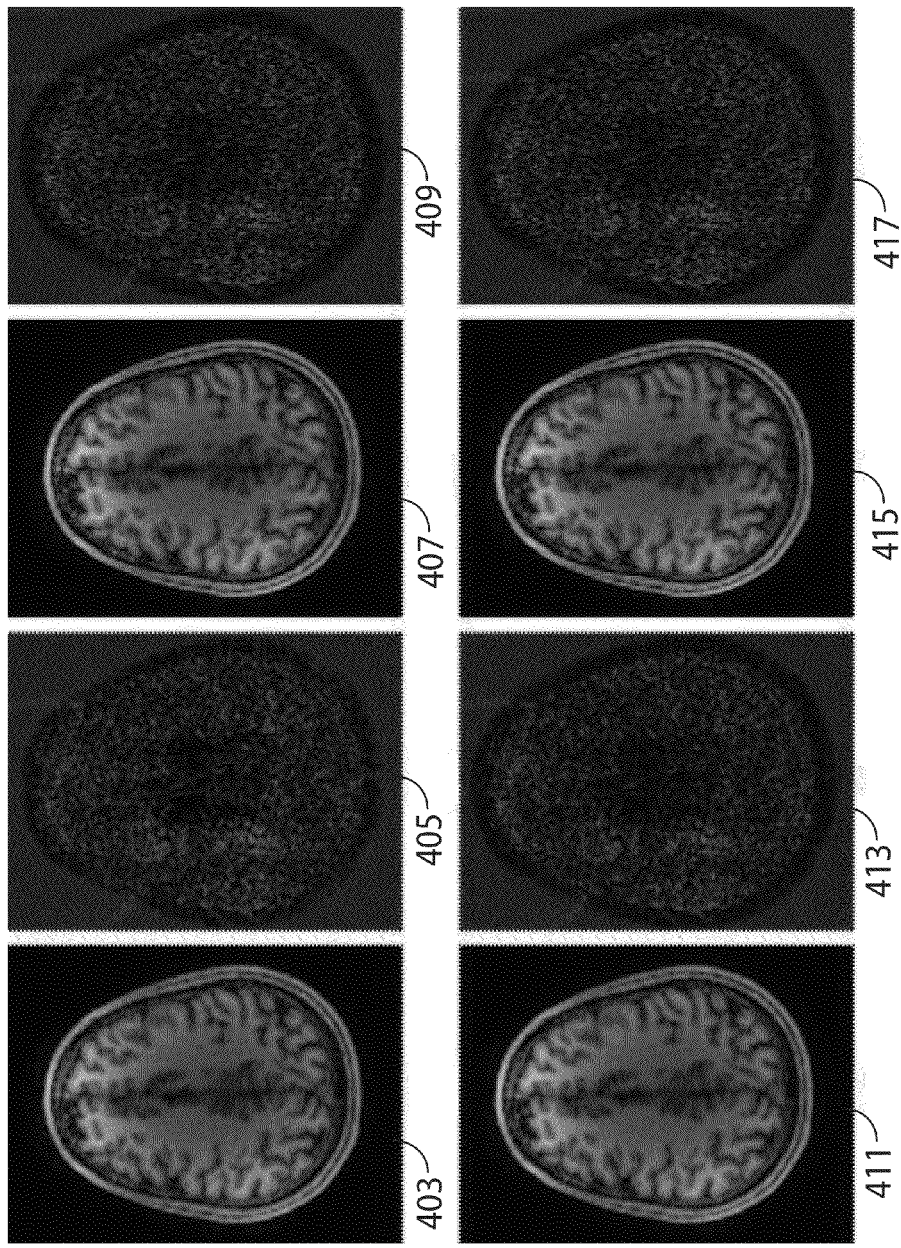
FIG. 4 shows images acquired using Sparse Reconstruction of Images employing a Nullspace method and GRAPPA (SpRING) method in accordance with the present invention.

Several experiments are performed to compare SpRING, to existing methods. The Cauchy penalty function-based SpRING reconstruction is performed on an axial slice of data uniformly undersampled in both directions by a factor of R=4, for $\alpha_0=1$, $\alpha_{max}=10^8$, $\beta=2$, and IRLS convergence tolerance of 0.01. The reconstruction is repeated for smaller $\alpha_{max}=10^4$, larger $\beta=10$, and a larger convergence tolerance of 0.1. The results shown in FIG. 4 illustrate that decreasing $\alpha_{max}$ reduces oversmoothing, increasing $\beta$ does not appear to significantly impact the quality of the reconstructed image, and increasing the tolerance has a larger negative impact on RMSE. While the initial reconstruction requires 1436 LSMR iterations, decreasing $\alpha_{max}$ reduces the number of iterations to 484, increasing $\beta$ further decreases the number of iterations to 220, and SpRING requires only 191 iterations with the increased convergence tolerance. For subsequent experiments, $\alpha_{max}=10^4$, $\beta=10$, and IRLS convergence tolerance of 0.01 are used. The results shown are for the finite-differences transform; similar results can be obtained for the DWT.

FIG. 4 shows images acquired by system 10 (FIG. 1) using Sparse Reconstruction of Images employing a Nullspace method and GRAPPA (SpRING) method implemented using different continuation strategies with R=4×4 uniform undersampling, $\alpha 0=1$, $\lambda=10$, and finite differences sparsifying transform. Image 403 is acquired with RMSE=0.03768 and image 405 is a corresponding difference image for $\alpha max=108$, $\beta=2$, and tolerance=0.01, image 407 is acquired with RMSE=0.03520 and image 409 is a corresponding difference image for $\alpha max=104$, $\beta=2$, and tolerance=0.01, image 411 is acquired with RMSE=0.03505 and image 413 is a corresponding difference image for $\alpha max=104$, $\beta=10$, and tolerance=0.01; and image 415 is an image acquired with RMSE=0.03551 having corresponding difference image 417 for $\alpha max=104$, $\beta=10$, and tolerance=0.1. A difference image as used herein is an image representation of a pixel-by-pixel difference between a magnitude image formed by combining reconstructed coil images and a magnitude image formed by combining reference coil images (unaccelerated, uncompressed images). A magnitude image is formed by retaining magnitude of the complex-valued signal at each pixel and discarding phase information.

Figure 5:
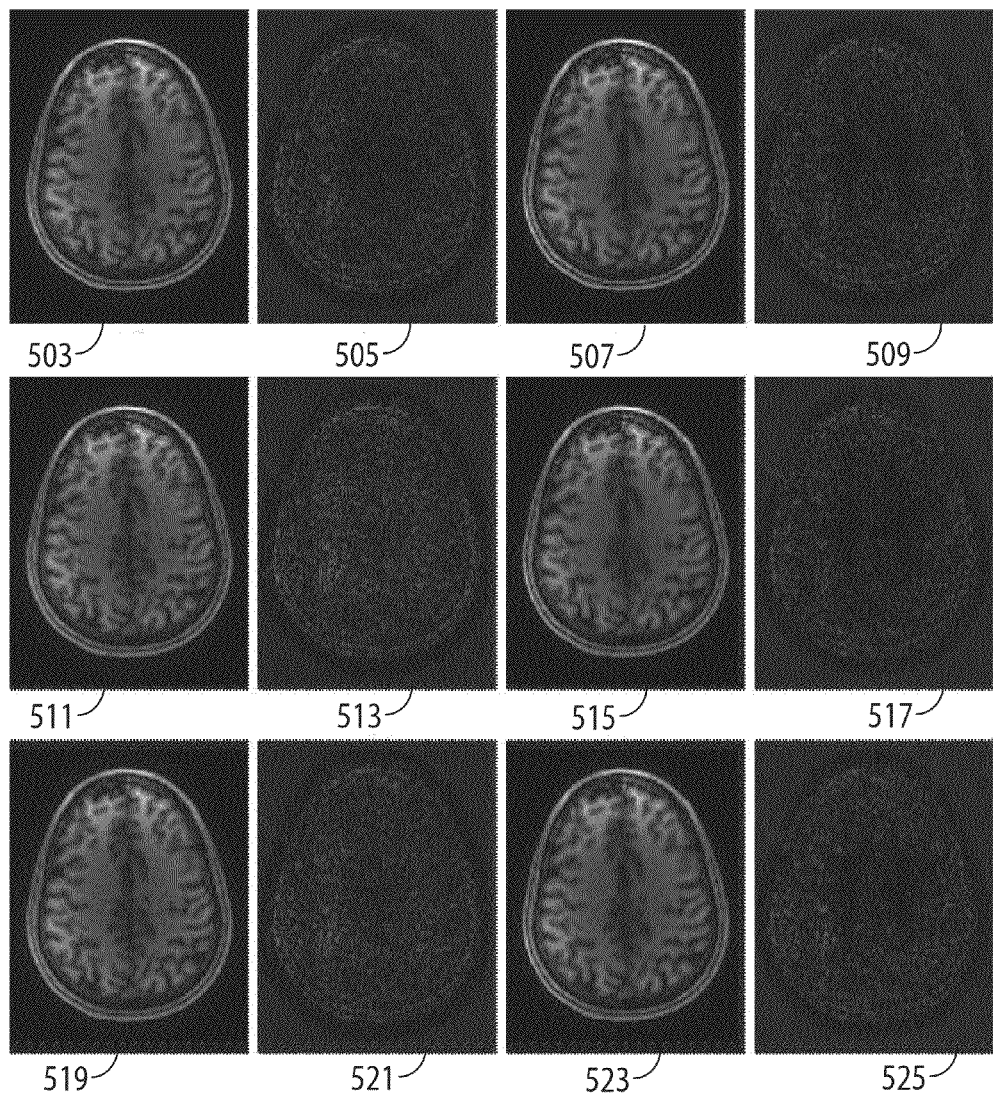
FIG. 5 shows images acquired using a SpRING method using different transforms and penalty functions in accordance with the present invention.

FIG. 5 shows images acquired by system 10 (FIG. 1) using a SpRING method using different transforms and penalty functions with R=4×4 uniform undersampling. Image 503 ($\lambda=100.2$) is acquired with RMSE=0.03541, corresponding difference image 505 with the DWT (4-level 9-7) and l1 penalty takes 152 seconds. Image 507 is acquired using a Cauchy penalty ($\lambda=1$) with RMSE=0.03414 with corresponding difference image 509 in 681 s. Image 511 is acquired ($\lambda=10-0.2$) with RMSE=0.03954 with corresponding difference image 513 with finite differences and l1 penalty takes 207 s. Image 515 is acquired using a Cauchy penalty ($\lambda=101.4$) with RMSE=0.03390 having corresponding difference image 517 acquired in 389 s. Image 519 is acquired ($\lambda=10-0.2$) with RMSE=0.03797 having corresponding difference image 521 with curvelet and l1 penalty takes 754 s. Image 523 is acquired using Cauchy penalty, ($\lambda=100.4$) with RMSE=0.03584 having correspondence difference image 525 acquired in 1781 s.

The performance of SpRING using different sparsifying transforms and penalty functions is shown for R=4×4 uniform undersampling in FIG. 5. Each reconstruction is repeated over a broad sweep of $\lambda$, and a result is shown. Since larger $\lambda$ emphasizes sparsity more, greater confidence in a sparsity model (sparsifying transform and penalty function) for the given image is inferred from a larger optimal value of $\lambda$. When compared to the $l_1$ norm SpRING results, the Cauchy penalty results tend to remove more noise while also increasing image smoothing. Quantitatively, the benefits of noise reduction outweigh the additional oversmoothing error as measured by RMSE. Comparing across sparsifying transforms, the DWT does reasonably well, and the finite differences transform performs slightly better. Curvelets perform adequately, although the blurring visible near the center of the Cauchy penalized curvelet reconstruction appears more noticeable than in the other images. Because the $L_1$ SPIR-iT method is implemented with the DWT, and the DWT performs reasonably well with SpRING, the DWT and Cauchy penalty function are used throughout the experiments that follow.

Figure 6:
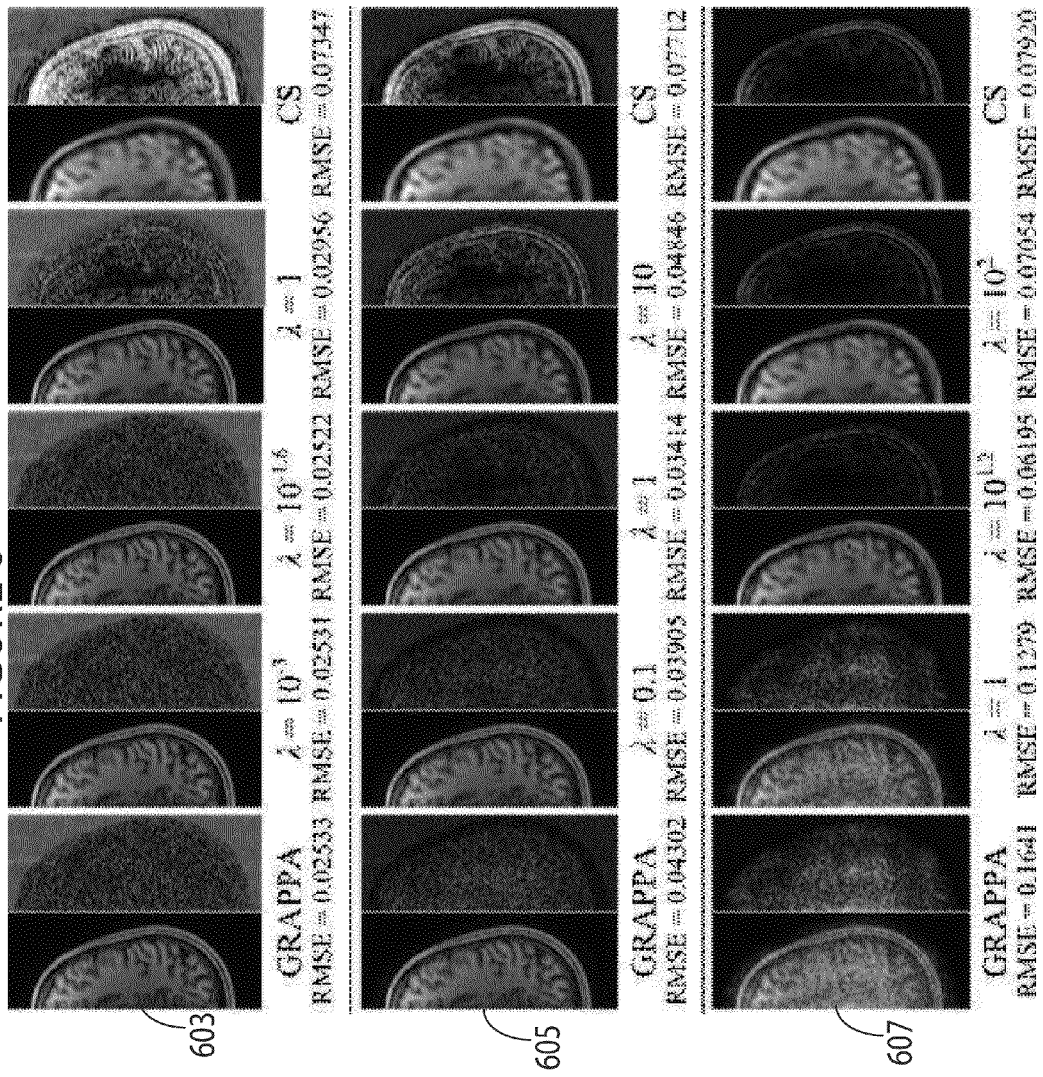
FIG. 6 shows images and difference images acquired using a SpRING method in accordance with the present invention.

FIG. 6 shows images and difference images acquired by system 10 using a SpRING method and corresponding difference images as $\lambda$ increases, images 603 are acquired with R=3×3, images 605 are acquired with R=4×4, and images 607 are acquired with R=5×5 uniform undersampling. When $\lambda$ is small, SpRING resembles GRAPPA, and as $\lambda$ increases, the SpRING result evolves closer to the result from CS alone. The optimal choice of $\lambda$ increases with R as the noise amplification due to GRAPPA worsens. This trend is demonstrated in FIG. 6, which portrays SpRING reconstructions as $\lambda$ increases from 0 (GRAPPA only) to ∞ (CS only), for R=3×3, 4×4, and 5×5 uniform acceleration.

Figure 7:
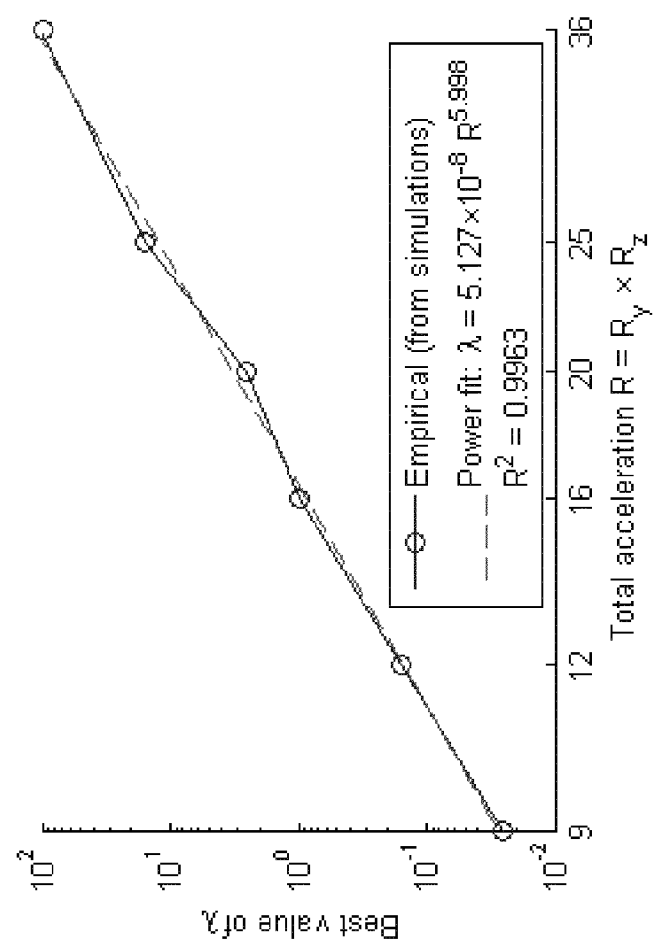
FIG. 7 shows a plot of value of $\lambda$ (a tuning parameter $\lambda$ determines relative importance of GRAPPA fidelity and sparsity) against total acceleration of image acquisition R in accordance with the present invention.

FIG. 7 shows a plot of best value of $\lambda$ (a tuning parameter $\lambda$ determining relative importance of GRAPPA fidelity and sparsity) against total acceleration of image acquisition R. The empirical optimal values of $\lambda$ are plotted (the solid line) on a log-log scale and a power fit regression is performed and plotted (the dashed line) against the empirical trend line. The squared correlation $r^2=0.9963$. As $\lambda$ increases, the SpRING result gradually transitions from looking like a GRAPPA result to resembling the CS result. The optimal $\lambda$ usually falls in the intermediate range of this transition, when the CS part is de-noising the GRAPPA result, but the CS artifacts are not too prevalent in the difference image. The slope of the linear relationship in the log-log plot of $\lambda$ vs. R suggests that the optimal $\lambda$ increases approximately as $R^6$ ($\lambda=5.127\times10^{-8} R^{5.998}$), with squared correlation 0.9963. This strong correlation may be used for choosing $\lambda$ for real-world acquisitions.

Figure 8:
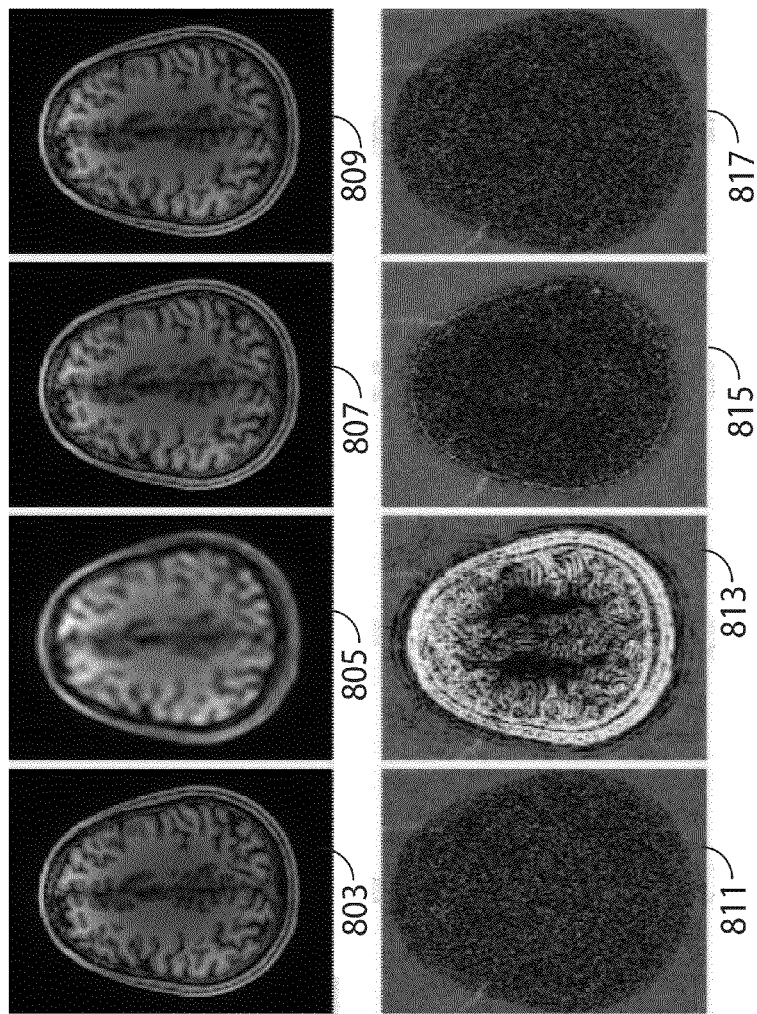
FIGS. 8-10 show images and difference images acquired using accelerated acquisition methods in accordance with the present invention.
Figure 9:
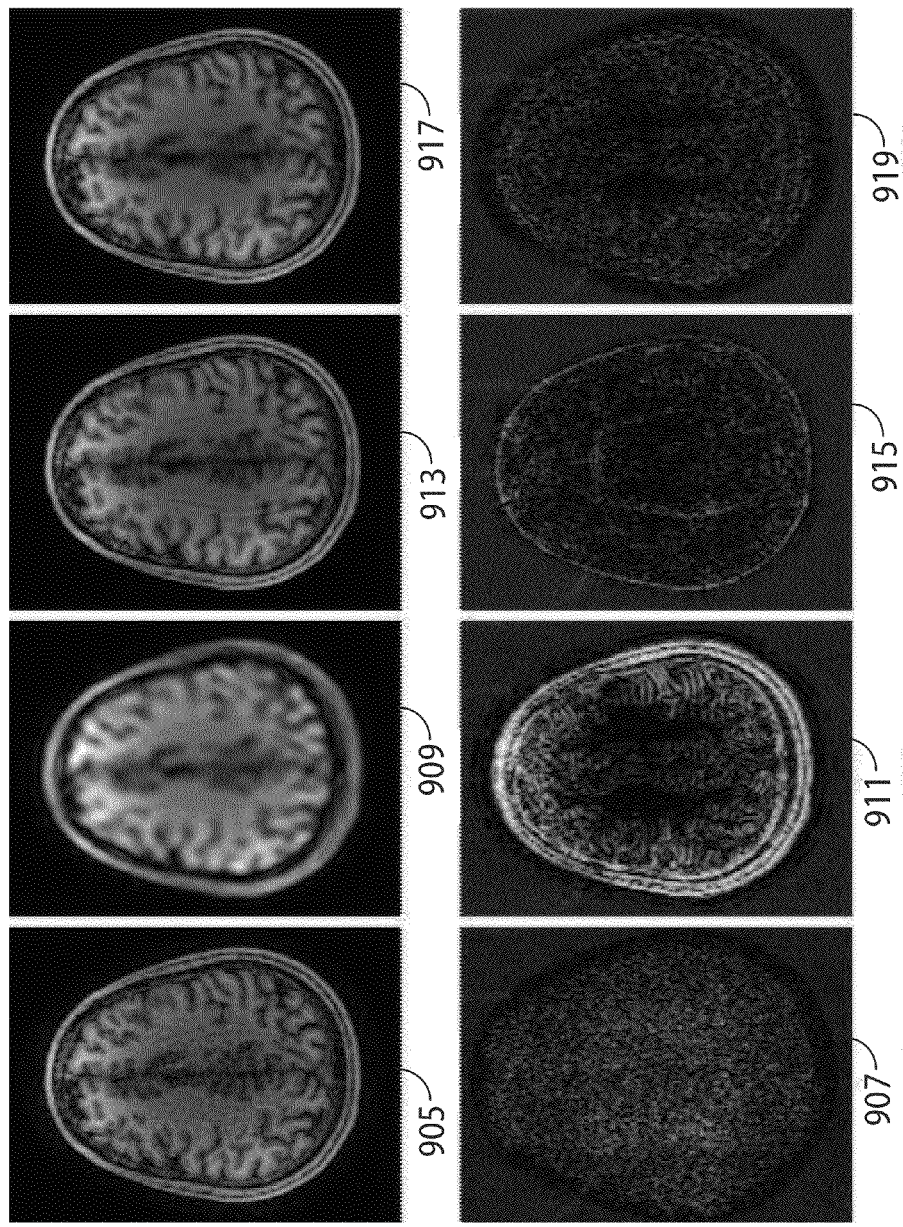
Figure 10:
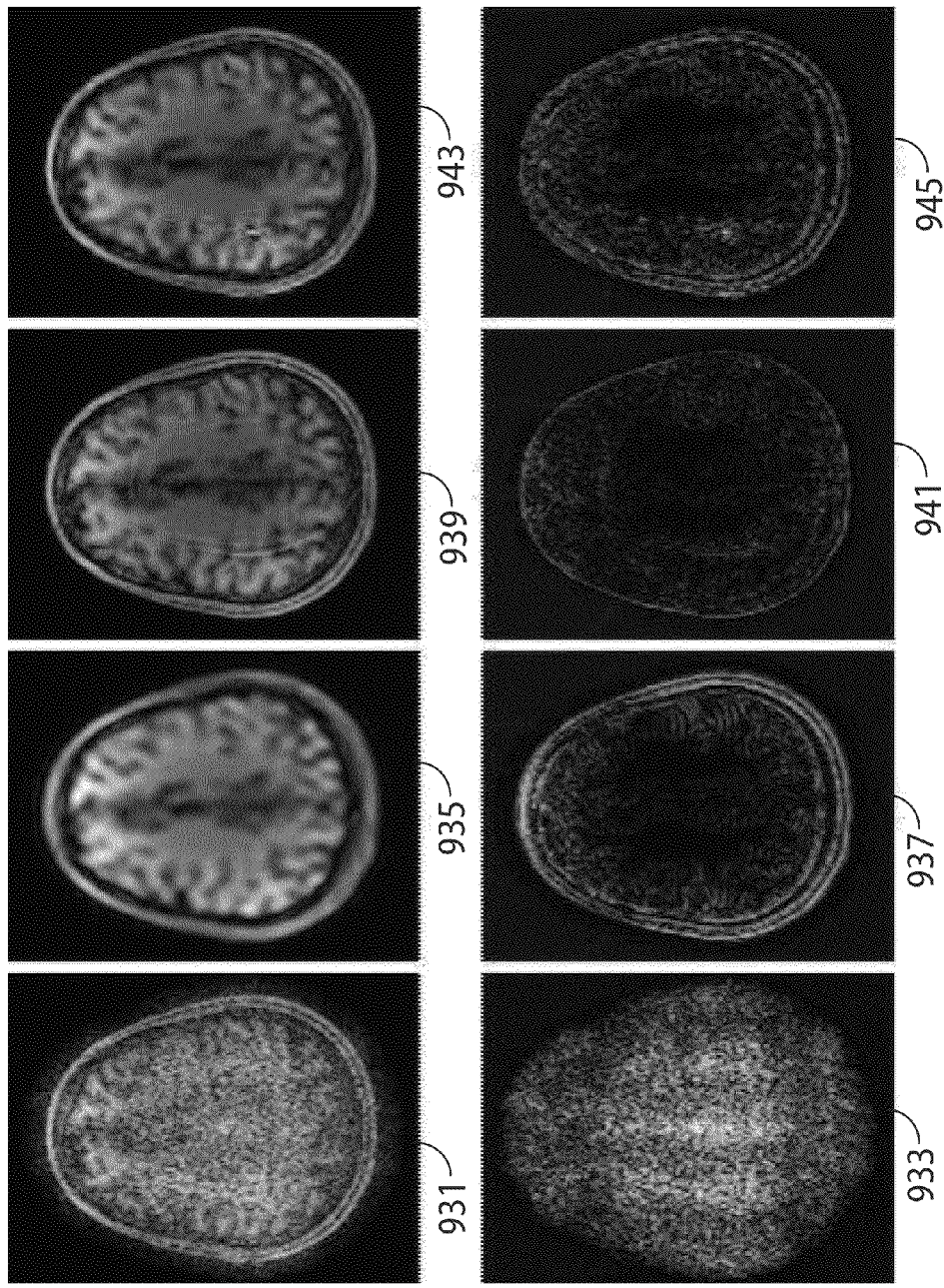

FIG. 8-10 shows images and difference images acquired using accelerated acquisition methods for various accelerations with performance comparisons with R=3×3 undersampling. Image 803 of FIG. 8 is acquired with difference image 811 for GRAPPA with RMSE=0.02533. Image 805 is acquired with difference image 813 for CS alone with RMSE=0.07347. Image 807 is acquired with difference image 815 for Li SPIR-iT ($\lambda=10-2.6$) with RMSE=0.02784. Image 809 is acquired with difference image 817 for SpRING ($\lambda=10-1.6$) with RMSE=0.02522. To demonstrate the generality of SpRING, GRAPPA, CS, and SpRING are applied to three different datasets collected using $T_1$-weighted MPRAGE sequences on the same MRI scanner described previously and uniformly undersampled by 4 in the phase- and partition-encoded directions. Since the undersampling and acquisition parameters are the same as for the slice used throughout the earlier figures, the same value of $\lambda$ ($\lambda=1$) for SpRING is used for the data sets. Since each dataset is fully sampled in the readout direction, the volumes are split into slices, and the slices are reconstructed in parallel. RMSE values for these datasets are tabulated in the table of FIG. 14. Specifically, FIG. 14 shows a table indicating root-mean-squared error (RMSE) for GRAPPA, CS, and SpRING reconstructions for three different MPRAGE datasets, each accelerated by a factor of R=4×4, using the same parameters as for a single slice performance comparison.

FIG. 9 shows images and difference images acquired using accelerated acquisition methods for various accelerations with performance comparisons with R=4×4 undersampling. Image 905 is acquired with corresponding difference image 907 for GRAPPA with RMSE=0.04302. Image 909 is acquired with corresponding difference image 911 for CS alone with RMSE=0.07712. Image 913 is acquired with corresponding difference image 915 for L1 SPIR-iT ($\lambda$=10−2.6) with RMSE=0.03584. Image 917 is acquired with corresponding difference image 919 for SpRING ($\lambda$=1) with RMSE=0.03414. FIG. 10 shows images and difference images acquired using accelerated acquisition methods for various accelerations with performance comparisons with R=4×4 undersampling. Image 931 is acquired with corresponding difference image 933 for GRAPPA with RMSE=0.1641. Image 935 is acquired with corresponding difference image 937 for CS alone with RMSE=0.07920. Image 939 is acquired with corresponding difference image 941 for L1 SPIR-iT ($\lambda$=10−2.6) with RMSE=0.04689. Image 943 is acquired with corresponding difference image 945 for SpRING ($\lambda$=101.2) with RMSE=0.06195.

Different trends are identified. As R increases, RMSE of the GRAPPA result increases significantly, while the CS result degrades slightly. Therefore, the gain from combining CS and GRAPPA becomes more evident at higher accelerations; however, at an acceleration of R=5×5, the joint method saturates, giving a reconstruction like CS alone. In addition, $L_1$ SPIR-iT appears to degrade far more slowly than GRAPPA, so using the SPIR-iT result in place of the GRAPPA result advantageously yields improved performance at high accelerations with only additional computational cost up front to compute the SPIR-iT result. However, unlike GRAPPA, the noise present in the difference image for SPIR-iT is more structured (at least for uniform undersampling) than for GRAPPA, so CS may not help as much as it does for de-noising a GRAPPA image. The improvement from reconstructing using SpRING over either GRAPPA or CS alone in each of the three 3-D data sets supports broad applicability of the system.

Figure 11:
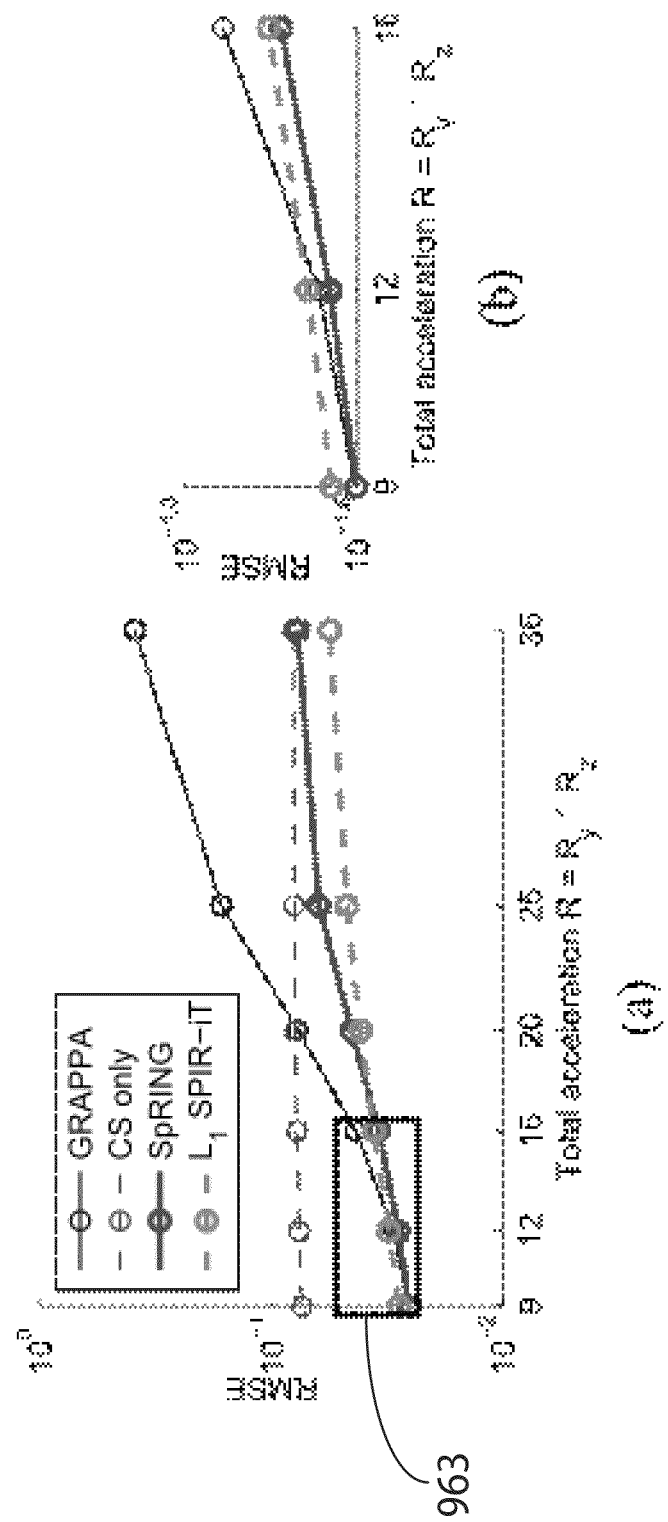
FIG. 11 (a) shows a plot of RMSE for GRAPPA, CS, SpRING, and L1 SPIR-iT reconstructions as a function of R and (b) shows an inset region (rectangle) of plot (a).
Figure 12:
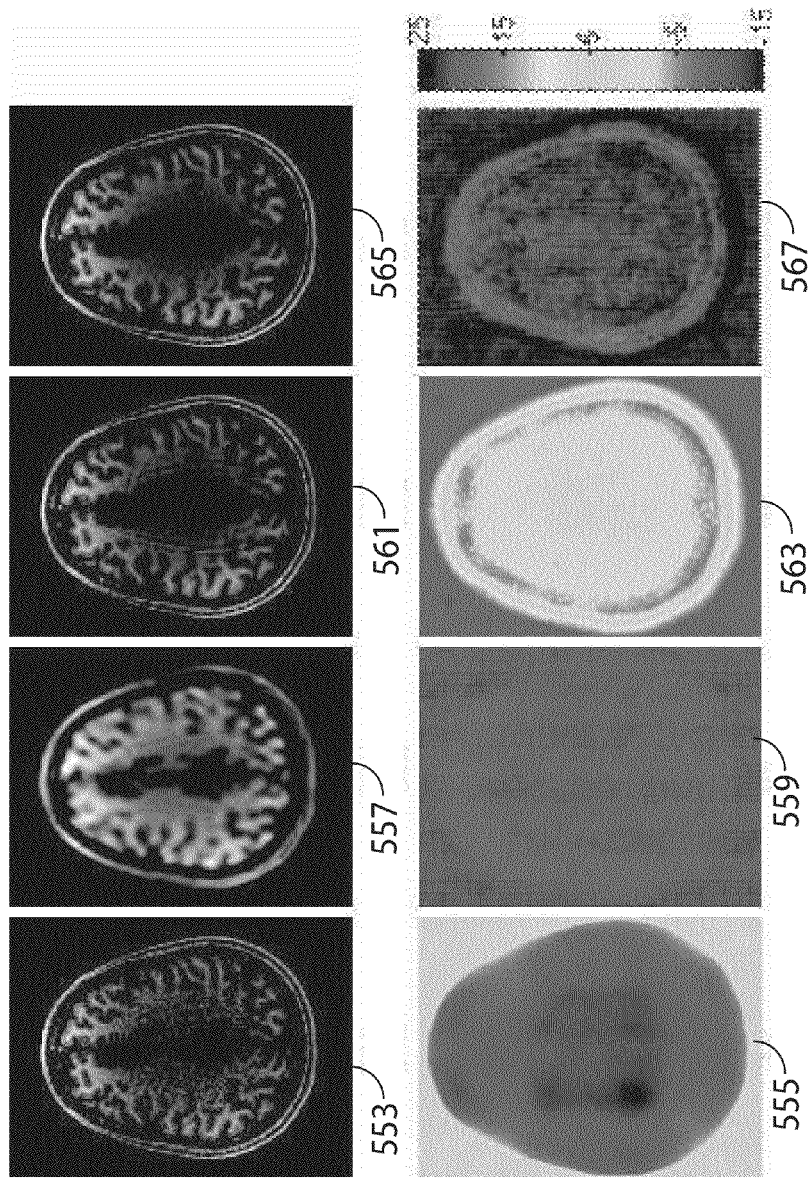
FIG. 12 show images and difference images acquired using accelerated acquisition methods in accordance with the present invention.

FIG. 11 (a) shows a plot of RMSE for GRAPPA, CS, SpRING, and L1 SPIR-iT reconstructions as a function of R and (b) shows an inset region (rectangle 963) of plot (a). FIG. 12 shows images and difference images acquired using accelerated acquisition methods illustrating comparison of g-factors, plotted as 1/g (SNR gain) in dB, alongside reconstructed slices for R=4×4 undersampling. Image 553 is acquired with corresponding inverse g-factor map 555 for GRAPPA, with mean g-factor −7.721 dB and max SNR loss −15.63 dB. Image 557 is acquired with corresponding inverse g-factor map 559 for CS alone, with mean g-factor +20.65 dB and min SNR gain +17.11 dB. Image 561 is acquired with an inverse g-factor map 563 for L1 SPIR-iT ($\lambda$=10−2.6), with mean g-factor +2.672 dB and max SNR loss −7.891 dB. Image 565 is acquired with an inverse g-factor map 567 for SpRING ($\lambda$=1), with mean g-factor +22.08 dB and min SNR gain +13.25 dB. The inverse g-factor maps are plotted on the same shade scale to facilitate comparison.

The combined image g-factors for 1× noise ($\Lambda_{AWGN}=\Lambda$) are shown in FIG. 12. GRAPPA, CS alone, SpRING, and $L_1$ SPIR-iT are displayed, using the same parameters as in the preceding performance comparisons, for R=4×4. The substantially lower noise amplification present in the CS and SpRING results confirms the suppression of noise enhancement from combining GRAPPA with CS. Due to the nonlinearity of these methods, these results would be expected to change when noise is increased beyond the 1× level. However, this implementation of $L_1$ SPIR-iT does not mitigate noise amplification as effectively for this acceleration factor. Thus, SpRING advantageously suppresses noise in comparison with the $L_1$ SPIR-iT method.

Different configurations used in implementing the SpRING framework for reconstructing anatomical brain MR images, include configurations of continuation, sparsifying transform and penalty function, and choice of $\lambda$. While changing the sparsifying transform and penalty function are determined to affect minimally the reconstructed image's RMSE, it is advantageously determined that the continuation parameters and the tuning parameter $\lambda$ impact SpRING's performance substantially. Success in applying the same parameters to several datasets indicates a degree of universality. The images depicting the results of reconstruction demonstrate SpRING improves SNR and indicates sparsity-enforced regularization is an effective de-noising method. By varying $\lambda$, a user or the system controls the image reconstruction to improve SNR or avoid blurring from oversmoothing, depending on the needs of a clinician. In addition, despite the CS component in the joint optimization method, the method functions properly with uniform undersampling, obviating the need to dramatically redesign pulse sequences used for acquisition; existing noisy GRAPPA reconstructions may also be improved by post-processing with the system.

SpRING exhibits several significant advantages over $L_1$ SPIR-iT. At high accelerations, the $L_1$ SPIR-iT reconstructions exhibit bothersome aliasing artifacts to a greater degree than SpRING reconstructions. As indicated by the g-factor maps, $L_1$ SPIR-iT does not appear nearly as robust in the presence of noise as the nonconvex CS and SpRING methods. SpRING is an advantageous improvement over $L_1$ SPIR-IT, for the type of reconstructions investigated here. Moreover, not having to convolve the SPIR-iT (or GRAPPA) kernel with the k-space data in every iteration of SpRING, as is done in $L_1$ SPIR-iT, means SpRING offers advantageously reduced computational complexity, making SpRING easier to implement.

Viewing sparsity in a Bayesian framework provides an interpretation of the systemic errors present in the CS-only and SpRING reconstructions. The optimization problem basically yields a maximum a posteriori (MAP) estimator, which in Bayesian estimation is the most likely values of the missing data, given the observations (GRAPPA result from acquired data). The systemic errors result from mismatch between the model posterior distribution and the true posterior distribution. This mismatch occurs in both the likelihood function and the prior distribution. The true likelihood function depends on true coil sensitivity profiles, and the true image depends on the anatomy of the imaged brain.

The system advantageously combines GRAPPA and CS. Adjusting the framework to accommodate non-uniform or non-Cartesian sampling patterns, using SPIR-iT or another non-uniform GRAPPA-like operator, and/or gridding techniques, facilitates wide applicability to pulse sequences. In addition, the system is advantageously implemented on a general processing unit (GPU), since the dominant computational operations (FFT, DWT, coil combination) are highly parallelizable and usable in clinical scanners.

Figure 15:
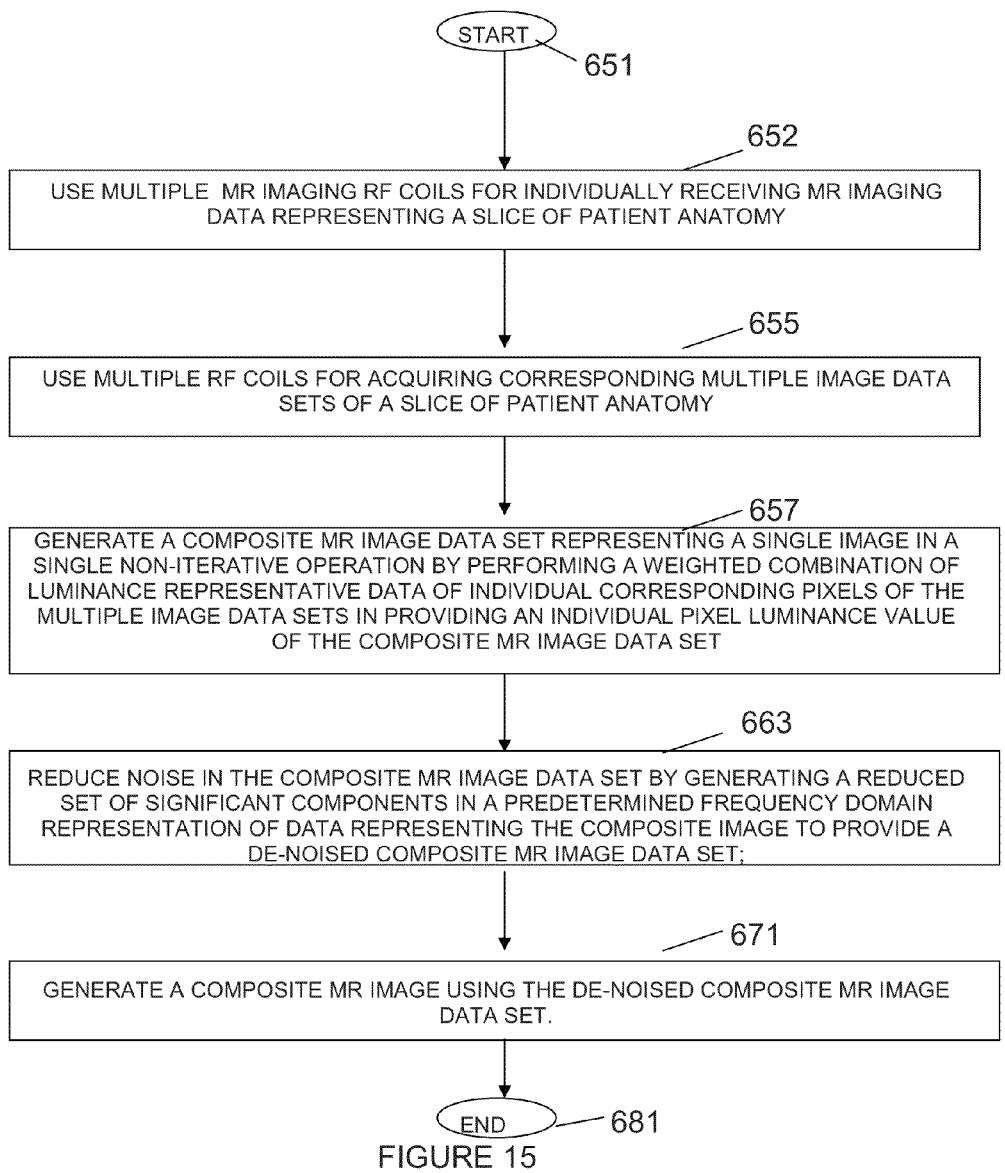
FIG. 15 is a flowchart of a process for parallel image processing performed by the system of FIG. 1 in accordance with the present invention.

FIG. 15 is a flowchart of a process for parallel image processing performed by system 10 of FIG. 1. In step 652 following the start at step 651, multiple MR imaging RF coils 24 individually receive MR imaging data representing a slice of patient anatomy. System 10 in step 655 uses the multiple RF coils 24 for acquiring corresponding multiple image data sets of the slice. An image data processor comprising at least one processing device in computer 40 in step 657 generates a composite MR image data set representing a single image in a single non-iterative operation by performing a weighted combination of luminance representative data of individual corresponding pixels of the multiple image data sets in providing an individual pixel luminance value of the composite MR image data set. The image data processor in step 663 reduces noise in the composite MR image data set by generating a reduced set of significant components in a predetermined transform domain representation of data representing the composite image to provide a de-noised composite MR image data set. The transform domain comprises at least one of, a Fourier Transform domain, a Wavelet Transform domain, a frequency domain and a sparsifying transform domain.

The image data processor generates the composite MR image data in a single non-iterative operation by using a parallel imaging method compatible with at least one of (a) SMASH (SiMultaneous Acquisition of SpatialHarmonics) and or (b) GRAPPA (Gene-Ralized Autocalibrating Partially Parallel Acquisition). The image data processor generates the reduced set of significant components in a predetermined wavelet representation of image data by using an inverse Fourier transform and a wavelet transform. Further, the image data processor iteratively and repetitively uses the inverse Fourier transform and the wavelet transform in iteratively converting image representative data components between frequency domain and time domain representations. In addition, the image data processor iteratively and repetitively uses the inverse Fourier transform and the wavelet transform in iteratively converting image representative data components between frequency domain and time domain representations in providing a compressed sensing sparse transformation.

The image data processor generates the reduced set of significant transform domain components by using a nonconvex function comprising at least one of, a Cauchy penalty function, a logarithmic function and an at least partially concave function. In one embodiment, the image data processor generates the reduced set of significant components in a predetermined finite difference function representation of image data by using an inverse Fourier transform and a finite difference transform and uses an image quality determination responsive to components of the composite MR image data set and components of the multiple image data sets, in selecting the reduced set of significant components. In step 671 an image generator in computer 40 comprising at least one processing device generates a composite MR image using the de-noised composite MR image data set. The process of FIG. 15 terminates at step 681

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device, A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouth, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 1-15 are not exclusive. Other systems, processes and menus may be derived in accordance with the principles of the invention to accomplish the same objectives. Other modifications are possible within the scope of the invention. For example, the subject to be scanned may be an animal subject or any other suitable object rather than a human patient. Also, the MR scanner 10 has been described in a simplified fashion and may be constructed in various well-known manners and using various well-known components. For example, the computer system 40 may incorporate the control portions of the various scanner 10 components or may be modularly constructed with separate but coordinated units, such as an image processing unit, user interfaces, MR image pulse sequence control unit, etc. Also, although the steps of each method have been described in a specific sequence, the order of the steps may be re-ordered in part or in whole. A system accelerates magnetic resonance (MR) imaging by adaptively selecting an appropriate sparsifying transform and penalty function to optimize trade-off between fidelity to a GRAPPA function and sparsity for different levels of acceleration. Further, the processes and applications may, in alternative embodiments, be located on one or more (e.g., distributed) processing devices on a network linking the units of FIG. 1. Any of the functions and steps provided in FIGS. 1-15 may be implemented in hardware, software or a combination of both.

What is claimed is:

1. A system for parallel image processing in MR imaging, comprising:

a plurality of MR imaging RF coils for individually receiving MR imaging data representing a slice of patient anatomy;

an MR imaging system for using the plurality of RF coils for acquiring a corresponding plurality of image data sets of said slice;

an image data processor comprising at least one processing device conditioned for, generating a composite MR image data set representing a single image in a single non-iterative operation by performing a weighted combination of luminance representative data of individual corresponding pixels of said plurality of image data sets in providing an individual pixel luminance value of said composite MR image data set and reducing noise in said composite MR image data set by generating a reduced set of significant components in a predetermined transform domain representation of data representing the composite image to provide a de-noised composite MR image data set; and an image generator comprising at least one processing device conditioned for generating a composite MR image using said de-noised composite MR image data set.

2. A system according to claim 1, wherein
said image data processor generates said composite MR image data in a single non-iterative operation by using a parallel imaging method compatible with at least one of (a) SMASH (SiMultaneous Acquisition of SpatialHarmonics) and (b) GRAPPA (Gene-Ralized Autocalibrating Partially Parallel Acquisition).

3. A system according to claim 1, wherein
said image data processor generates said reduced set of significant components in a predetermined wavelet representation of image data by using an inverse Fourier transform and a wavelet transform.

4. A system according to claim 3, wherein
said image data processor iteratively and repetitively uses said inverse Fourier transform and said wavelet transform in iteratively converting image representative data components between frequency domain and time domain representations.

5. A system according to claim 4, wherein
said image data processor iteratively and repetitively uses said inverse Fourier transform and said wavelet transform in iteratively converting image representative data components between frequency domain and time domain representations in providing a compressed sensing sparse transformation.

6. A system according to claim 3, wherein
said image data processor generates said reduced set of significant transform domain components by using a nonconvex function.

7. A system according to claim 1, wherein
said image data processor generates said reduced set of significant transform domain components by using a nonconvex function.

8. A system according to claim 7, wherein
said nonconvex function is a Cauchy penalty function.

9. A system according to claim 7, wherein
said nonconvex function is logarithmic function.

10. A system according to claim 7, wherein
said nonconvex function comprises an at least partially concave function.

11. A system according to claim 1, wherein
said image data processor generates said reduced set of significant components in a predetermined finite difference function representation of image data by using an inverse Fourier transform and a finite difference transform.

12. A system according to claim 1, wherein
said image data processor uses an image quality determination responsive to components of said composite MR image data set and components of said plurality of image data sets, in selecting said reduced set of significant components.

13. A system according to claim 1, wherein
said transform domain comprises at least one of, (a) a Fourier Transform domain, (b) a Wavelet Transform domain and (c) a frequency domain.

14. A system according to claim 1, wherein
said transform domain comprises a sparsifying transform domain.

15. A method for parallel image processing in MR imaging, comprising the activities of:

using a plurality of RF coils for acquiring a corresponding plurality of image data sets of a slice of patient anatomy;

generating a composite MR image data set representing a single image in a single non-iterative operation by performing a weighted combination of luminance representative data of individual corresponding pixels of said plurality of image data sets in providing an individual pixel luminance value of said composite MR image data set;

reducing noise in said composite MR image data set by generating a reduced set of significant components in a predetermined frequency domain representation of data representing the composite image to provide a de-noised composite MR image data set; and generating a composite MR image using said de-noised composite MR image data set.

* * * * *